United States Patent
Leskowitz

(10) Patent No.: US 9,952,294 B2
(45) Date of Patent: Apr. 24, 2018

(54) LATTICE CONFIGURATIONS OF POLYHEDRAL COMPONENT MAGNETS

(71) Applicant: NANALYSIS CORP., Calgary (CA)

(72) Inventor: Garett M. Leskowitz, Calgary (CA)

(73) Assignee: NANALYSIS CORP., Calgary (CA)

( * ) Notice: Subject to any disclaimer, the term of this patent is extended or adjusted under 35 U.S.C. 154(b) by 640 days.

(21) Appl. No.: 14/293,544

(22) Filed: Jun. 2, 2014

(65) Prior Publication Data

US 2015/0061680 A1 Mar. 5, 2015

Related U.S. Application Data

(60) Provisional application No. 61/830,467, filed on Jun. 3, 2013.

(51) Int. Cl.
*G01R 33/383* (2006.01)
*G01R 33/28* (2006.01)
(Continued)

(52) U.S. Cl.
CPC .......... *G01R 33/28* (2013.01); *G01R 33/383* (2013.01); *G01R 33/3873* (2013.01);
(Continued)

(58) Field of Classification Search
CPC ...... G01R 33/28; G01R 33/48; G01R 33/383; G01R 33/3873; H01F 7/0278; H01F 7/0273
See application file for complete search history.

(56) References Cited

U.S. PATENT DOCUMENTS

| | | |
|---|---|---|
| 4,837,542 A | 6/1989 | Leupold |
| 5,028,903 A | 7/1991 | Aubert |
| | (Continued) | |

FOREIGN PATENT DOCUMENTS

| | | |
|---|---|---|
| EP | 0675554 A1 | 10/1995 |
| EP | 2365353 A1 | 9/2011 |
| | (Continued) | |

OTHER PUBLICATIONS

K. Halbach, "Design of permanent multipole magnets with oriented rare earth cobalt material," Nuclear Instruments and Methods 169, 1, 1980.
(Continued)

*Primary Examiner* — David M Gray
*Assistant Examiner* — Laura Roth
(74) *Attorney, Agent, or Firm* — Michael G. Johnston; Moore & Van Allen PLLC

(57) ABSTRACT

There are disclosed magnet arrays and methods for generating magnetic fields. In embodiments magnet arrays comprise a plurality of polyhedral magnets arranged in a lattice configuration and at least partly enclosing a testing volume, the magnet array having an associated magnetic field with a designated field direction $\hat{v}$, wherein the magnetization direction $\hat{m}$ of an individual polyhedral magnet located at a displacement vector $\vec{r}$ from an origin point in the testing volume is determined by the formula: $\hat{m}=(2(\hat{v}\cdot\vec{r})\vec{r}-(\vec{r}\cdot\vec{r})\hat{v})/\vec{r}\cdot\vec{r}$. In embodiments the arrays are comprised in magnetic resonance machines. In embodiments the polyhedral magnets are truncated cubes or are rhombic dodecahedra.

22 Claims, 21 Drawing Sheets

(51) Int. Cl.
  *G01R 33/3873* (2006.01)
  *G01R 33/48* (2006.01)
  *H01F 7/02* (2006.01)

(52) U.S. Cl.
  CPC ........... *G01R 33/48* (2013.01); *H01F 7/0273* (2013.01); *H01F 7/0278* (2013.01)

(56) References Cited

U.S. PATENT DOCUMENTS

| | | | | |
|---|---|---|---|---|
| 5,119,057 | A * | 6/1992 | Abele | H01F 7/0278 335/304 |
| 5,418,462 | A | 5/1995 | Breneman | |
| 6,680,663 | B1 | 1/2004 | Lee et al. | |
| 7,373,716 | B2 | 5/2008 | Ras et al. | |
| 2011/0137589 | A1 | 6/2011 | Leskowitz et al. | |
| 2013/0127285 | A1 | 5/2013 | Yano | |
| 2013/0335079 | A1* | 12/2013 | Samoson | G01R 33/307 324/309 |
| 2014/0152409 | A1* | 6/2014 | Rotem | G01R 33/383 335/306 |

FOREIGN PATENT DOCUMENTS

| | | |
|---|---|---|
| JP | 06-196315 A | 7/1994 |
| JP | 2000-31562 A | 1/2000 |
| WO | 2007120057 A1 | 10/2007 |

OTHER PUBLICATIONS

J. Mallinson, "One-sided fluxes—a magnetic curiosity?" IEEE Transactions on Magnetics 9, 678, 1973.
F. Bertora, A. Trequattrini, M. G. Abele, and H. Rusinek, "Shimming of yokeless permanent magnets designed to generate uniform fields," Journal of Applied Physics 73, 6864, 1993, Only Abstract submitted, only abstract has been considered..
E. Danieli, J. Mauler, J. Perlo, B. Blumich, and F Casanova, Mobile sensor for high resolution NMR spectroscopy and imaging Journal of Magnetic Resonance 198, 80, 2009, Only Abstract submitted, only abstract has been considered..
E. Lord, "Tiling space with regular and semi-regular polyhedra," http://met.iisc.ernet.in/~lord/webfiles/clusters/andreini.pdf, accessed May 29, 2013.
F. Bloch, O. Cugat, G. Meunier, J. Toussaint, "Innovating approaches to the generation of intense magnetic fields: design and optimization of a 4 tesla permanent magnet flux source," IEEE Transactions on Magnetics 34, 2465, 1998, Only Abstract submitted, only abstract has been considered..
H.A. Leupold et al. Journal of Applied Physics vol. 87, No. 9, p. 4730-4 (2000), Only Abstract submitted, only abstract has been considered..
J. Chen, Y Zhang, and J Xiao, "Design and analysis of the novel test tube magnet for portable NMR device," Progress in Electromagnetics Research Symposium (PIERS) Online, 3 (6), 900-904 (2007), Only Abstract submitted, only abstract has been considered..
"Polyhedra and Packings" (Steurer et al) in "Crystallography of Quasicrystals", Springer Series in Materials Science vol. 126, 2009.
Windt, C.W., et al., A portable Halbach magnet that can be opened and closed without force: The NMR-CUFF, Journal of Magnetic Resonance, 2011, pp. 27-33, vol. 208.
Nanalysis Corp., UK Application No. GB1521572.6, Examination Report, dated May 9, 2016.
European Patent Application No. 1480683, Supplementary European Search Report, dated Apr. 21, 2017.
Danieli, Ernesto, et al.; "Mobile sensor for high resolution NMR spectroscopy and imaging," Journal of Magnetic Resonance, 2009, pp. 80-87, vol. 198.
Nanalysis Corp.; Office Action for Chinese Application No. 201480042776.8 dated Feb. 4, 2017, 15 Pages.

* cited by examiner

LATTICE CONFIGURATIONS OF POLYHEDRAL COMPONENT MAGNETS

CROSS-REFERENCES

This application is related to U.S. provisional application No. 61/830,467, filed Jun. 3, 2013, entitled "MAGNET ASSEMBLIES", naming Garett M. Leskowitz as the inventor. The contents of the provisional application are incorporated herein by reference in their entirety, and the benefit of the filing date of the provisional application is hereby claimed for all purposes that are legally served by such claim for the benefit of the filing date.

FIELD

The present disclosure relates to designs for magnet arrays and in particular to magnet arrays for use in magnetic resonance applications.

BACKGROUND

Relevant background documents include:
1. K. Halbach, "Design of permanent multipole magnets with oriented rare earth cobalt material," *Nuclear Instruments and Methods* 169, 1, 1980.
2. J. Mallinson, "One-sided fluxes—a magnetic curiosity?" *IEEE Transactions on Magnetics* 9, 678, 1973.
3. F. Bertora, A. Trequattrini, M. G. Abele, and H. Rusinek, "Shimming of yokeless permanent magnets designed to generate uniform fields," *Journal of Applied Physics* 73, 6864, 1993.
4. E. Danieli, J. Mauler, J. Perlo, B. Blumich, and F. Casanova, "Mobile sensor for high resolution NMR spectroscopy and imaging, *Journal of Magnetic Resonance* 198, 80, 2009.
5. E. Lord, "Tiling space with regular and semi-regular polyhedra," http://met.iisc.ernet.in/~lord/webfiles/clusters/andreini.pdf, accessed May 29, 2013.
6. F. Bloch, O. Cugat, G. Meunier, J. Toussaint, "Innovating approaches to the generation of intense magnetic fields: design and optimization of a 4 tesla permanent magnet flux source," *IEEE Transactions on Magnetics* 34, 2465, 1998.
7. U.S. Pat. No. 4,837,542 to H. Leupold, "Hollow substantially hemispherical permanent magnet high-field flux source for producing a uniform high field," 1989.
8. U.S. Patent Application 2011/0137589, G. Leskowitz, G. McFeetors, and S. Pernecker, "Method and apparatus for producing homogeneous magnetic fields," 2011.
9. U.S. Pat. No. 7,373,716 to Ras, "Method for Constructing Permanent Magnet Assemblies," 2008.
10. N. A. Leupold et al., Journal of Applied Physics, vol 87, no 9, p. 4730-4 (2000)
11. J. Chen, Y Zhang, and J Xiao, "Design and analysis of the novel test tube magnet for portable NMR device," *Progress in Electromagnetics Research Symposium (PIERS) Online*, 3 (6), 900-904 (2007).

One design for producing a substantially strong magnetic field in a small volume is the Halbach cylinder, wherein magnetic dipoles within high-coercivity permanent magnet materials are arranged around a central cavity. FIG. 1 shows a cross-sectional view of an idealization of a Halbach cylinder 10, along with a coordinate system that is used to compute and select the orientations of magnetic dipoles, shown as arrows 11, within a region surrounding a central volume 12. In the idealized Halbach cylinder, magnetization direction $\hat{m}$ is position-dependent according to the equation $$\hat{m}(\rho,\theta,z) = \cos(k\theta)\hat{\rho} + \sin(k\theta)\hat{\theta}$$

in cylindrical polar coordinates $\rho$, $\theta$, z, with integer parameter k=1 for the most prevalent case, which produces a substantially uniform field in the central volume 12. Other choices of k provide different, non-uniform field configurations. In practical implementations, discrete component magnets are used, as an approximation to the continuously varying magnetization suggested by FIG. 1.

FIGS. 2A, 2B, and 2C show example prior-art implementations of Halbach-cylinder-based magnet configurations. FIG. 2A, adapted from Bertora et al., shows a cylindrical configuration of magnets designated 20 surrounding space 24, that makes efficient use of space but employs many oblique shapes 21, 22, 23 in its design. FIG. 2B, adapted from Danieli, is an array 30 that uses simple shapes 31 to enclose space 32 but suffers from low packing density. When the space surrounding a central volume is broken up into regions, the individual component magnets placed therein may exhibit oblique shapes, such as those shown in FIG. 2A, that are difficult or expensive to fabricate with high tolerance. The magnetizations required within the component magnets may also be difficult to control with precision sufficient to ensure the quality of the magnetic field within the central volume. If, instead, simpler component magnets such as cubes are used, as in FIG. 2B, these can be fabricated and magnetized with high precision straightforwardly, but the geometrical constraints for some designs can result in a low packing density, with an attendant reduction in the field strength that can be produced. FIG. 2C is a cross section of an embodiment of a Halbach cylinder 40 comprising an array of closely packed hexagonal prisms 41 surrounding central space 42, disclosed in Leskowitz et al., U.S. Patent Application 2011/0137589.

In a Halbach-cylinder model the design ideal is an infinitely long cylinder. In practice, the cylinder is of finite length, which can lead to various technical problems and undesirable features in the primary magnetic field of the array, and designs attempting to overcome these disadvantages can be complex. An alternative approach for producing homogeneous fields therefore uses a Halbach sphere, practical embodiments of which have been suggested by Leupold.

FIG. 3A shows a sphere 50 enclosing a central cavity 51 and having local magnetic dipole orientations 52. Once a desired magnetic field axis, $\hat{v}$, is selected, the required magnetization directions for the component magnets in the assembly can be calculated by establishing a spherical polar coordinate system with colatitude angle $\theta=0$ along the magnetic field direction, then calculating the magnetization direction for the given magnet's center coordinates.

In order to best approximate a uniform field in the idealized case, magnetization direction $\hat{m}$ within the spherical shell surrounding the central cavity is position-dependent according to the equation $$\hat{m}(r,\theta,\phi) = \cos(k\theta)\hat{r} + \sin(k\theta)\hat{\theta}$$

in spherical polar coordinates r, $\theta$, $\phi$, again with parameter k=1 for the uniform-field case. It will be observed that magnetization in the spherical case differs from the magnetization in the cylindrical case. In the Halbach sphere model, the magnetization of the dipole at a position $\vec{r} = r\hat{r}$ lies in the meridional plane spanned by $\hat{r}$ and $\hat{\theta}$, but in the Halbach cylinder model, the magnetization lies in a plane spanned by $\hat{\rho} = r\hat{r} - z\hat{z}$ and $\hat{\theta}$, the former unit vector being the one directed away from the cylindrical symmetry axis. In particular, in the idealized Halbach cylinder case, the magnetization direction has no $\hat{z}$ component (along the cylindrical symmetry axis) and is independent of the z coordinate of the dipole's position. A variety of numerical representations of such position-dependent magnetizations are possible and will be readily identified and understood by those skilled in the art.

Such spherical assemblies are generally composed of combinations of magnets having complex shapes, as illustrated in FIG. 3B, adapted from Leupold. In FIG. 3B, it will be seen that the sphere 60 comprises multiple component primary magnets 61 having chosen dipole orientations 62 and surrounding central cavity 63. In order to achieve the desired conformation and field, a large number of different primary magnets having different shapes and magnetic orientations is required.

SUMMARY

According to embodiments, a magnet array is provided that comprises one or more polyhedral magnets. In embodiments such arrays provide a design context within which practical implementations of Halbach spheres or other compact magnetic configurations are possible. In embodiments, the magnets are made of high-coercivity materials and are configured based on a lattice.

In a first series of embodiments there is disclosed a magnet array comprising: a plurality of polyhedral magnets arranged in a lattice configuration and at least partly enclosing a testing volume, the magnet array having an associated magnetic field with a designated field direction $\hat{v}$, wherein the magnetization direction $\hat{m}$ of an individual polyhedral magnet located at a displacement vector $\vec{r}$ from an origin point in the testing volume is determined by the formula: $\hat{m}=(2(\hat{v}\cdot\vec{r})\vec{r}-(\vec{r}\cdot\vec{r})\hat{v})/\vec{r}\cdot\vec{r}$.

In further embodiments individual ones of the polyhedral magnets are selected from the group consisting of: a truncated cube; a rhombic dodecahedron; a Platonic solid; an Archimedean solid; a Johnson solid; a chamfered polyhedron; and a truncated polyhedron.

In further embodiments the lattice is a Bravais lattice.

In further embodiments the lattice is a simple cubic lattice, a body centered cubic lattice, a face centered cubic lattice, or a hexagonal lattice.

In further embodiments the polyhedral magnets comprise pluralities of first and second polyhedral magnets, the second polyhedral magnets being smaller than the first polyhedral magnets and a plurality of the second polyhedral magnets at least partly define a sample channel.

In further embodiments the direction V corresponds to a body diagonal of the magnet array, a face normal axis of the magnet array, or a face diagonal of the magnet array.

In further embodiments the sample channel is oriented along a body diagonal of the magnet array.

In further embodiments individual ones of the first polyhedral magnets have a magnetization direction $\hat{m}$ selected from a finite set of possible values compatible with the array having the desired magnetic field direction $\hat{v}$.

In further embodiments the magnet array further comprises a sample rotator.

In further series of embodiments there is disclosed a magnetic resonance device comprising the magnet array according to other embodiments.

In further embodiments there is disclosed a method for generating a magnetic field having a field direction $\hat{v}$, the method comprising providing an array of polyhedral magnets in a lattice configuration, wherein the magnetization direction $\hat{m}$ of an individual polyhedral magnet located at a displacement vector $\vec{r}$ from an origin point is determined by the formula: $\hat{m}=(2(\hat{v}\cdot\vec{r})\vec{r}-(\vec{r}\cdot\vec{r})\hat{v})/\vec{r}\cdot\vec{r}$.

In further embodiments individual ones of the polyhedral magnets are selected from the group consisting of: a truncated cube; a rhombic dodecahedron; a Platonic solid; an Archimedean solid; a Johnson solid; a chamfered polyhedron; and a truncated polyhedron.

In embodiments the polyhedral magnets are truncated cubes and wherein the direction v corresponds to a body diagonal of the magnet array or to a face normal axis of the magnet array or a face diagonal of the magnet array.

In embodiments the lattice is a Bravais lattice.

In embodiments the lattice is a simple cubic lattice, a body centered cubic lattice, a face centered cubic lattice, or a hexagonal lattice.

In embodiments the method further comprises providing a testing volume within the magnet array and wherein the polyhedral magnets comprise pluralities of first and second polyhedral magnets, the second polyhedral magnets being smaller than the first polyhedral magnets and wherein a plurality of the second polyhedral magnets at least partly define a sample channel.

In further embodiments there are disclosed methods for determining the magnetic resonance properties of a sample, the methods comprising positioning the sample in a magnetic field in accordance with other embodiments.

In a further series of embodiments there is disclosed a shimming assembly for the magnet assembly according embodiments wherein the shimming assembly comprises polyhedral magnets disposed in a lattice configuration, the magnets movable within the magnet assembly.

In a further series of embodiments there is disclosed a shimming assembly for the magnet array according to embodiments, the shimming assembly comprising polyhedral shimming magnets comprised within the magnet array, the shimming magnets actuable by a user to move within the magnet assembly.

In a further series of embodiments the magnet array comprises a plurality of shimming magnets occupying positions within said lattice configuration.

In embodiments there is also disclosed a method for shimming a magnetic field generated by the magnet array according to embodiments, the method comprising the steps of: a) obtaining a functional representation of the effect of moving the one of the plurality of shimming magnets on the magnetic field; b) repeating step a) for each one of the plurality of shimming magnets; c) deriving a sum function of the results of steps a) and b); and d) monitoring the magnetic field while adjusting the positions of ones of the shimming magnets.

In embodiments there is disclosed a magnetic resonance device comprising a magnet array comprising first and second polyhedral magnets arranged in a lattice configuration and at least partly enclosing a testing volume, wherein the first and second polyhedral magnets are truncated cubes and the second polyhedral magnets are smaller than the first polyhedral magnets and at least partly define a sample channel extending along a body diagonal of the magnet array.

Features and advantages of the subject matter hereof will become more apparent in light of the following detailed description of selected embodiments, as illustrated in the accompanying figures. The subject matter disclosed is capable of modifications in various respects, all without departing from the scope of the claims. Accordingly, the drawings and the description are to be regarded as illustrative in nature, and not as restrictive.

BRIEF DESCRIPTION OF THE DRAWINGS

FIGS. 6 through 9 illustrate the primary magnet layers of a magnet array of a first embodiment according to FIG. 10A with frames used to assemble the magnet layers to form the array.

DETAILED DESCRIPTION OF EMBODIMENTS

Definitions of Terms

Figure 1:
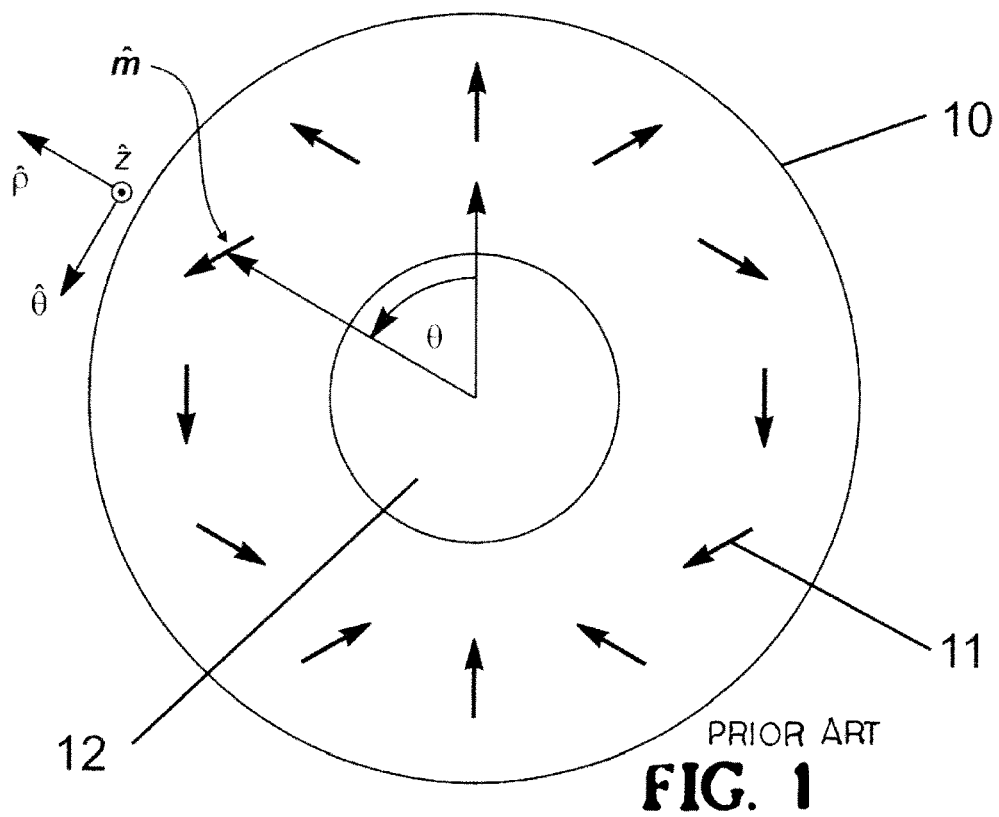
FIG. 1 is a cross-sectional view of an idealized Halbach cylinder.
Figure 2A:
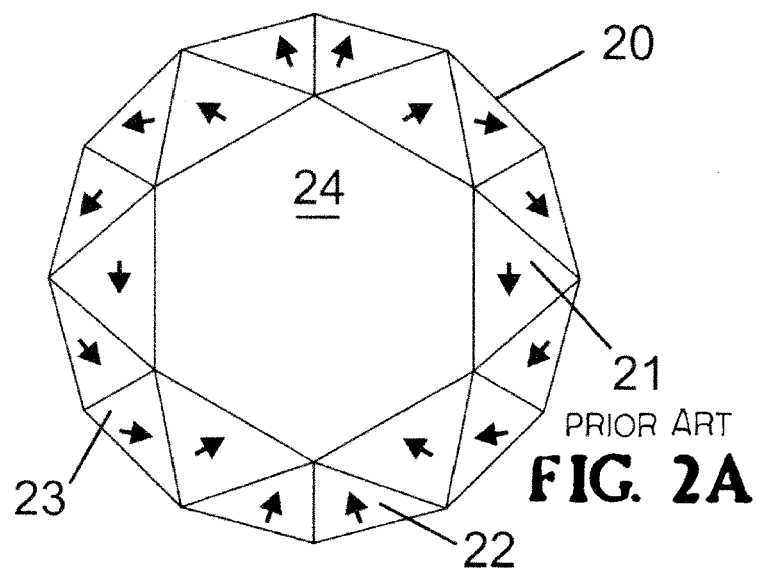
FIGS. 2A-2C are cross-sectional views of implementations of Halbach-cylinder-based magnet assemblies.
Figure 2B:
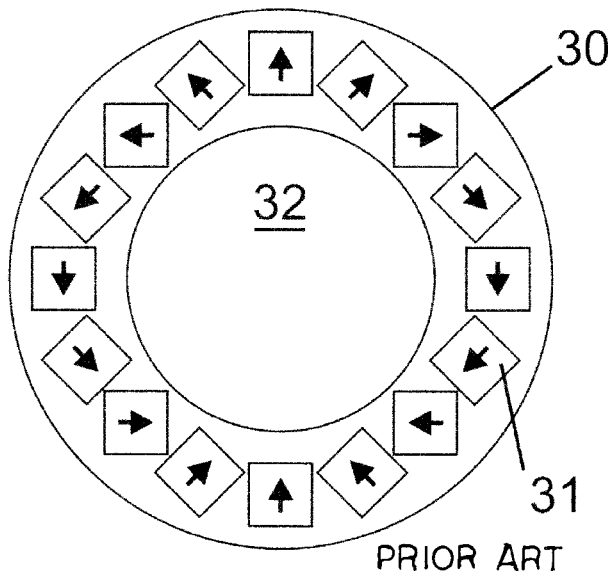
Figure 2C:
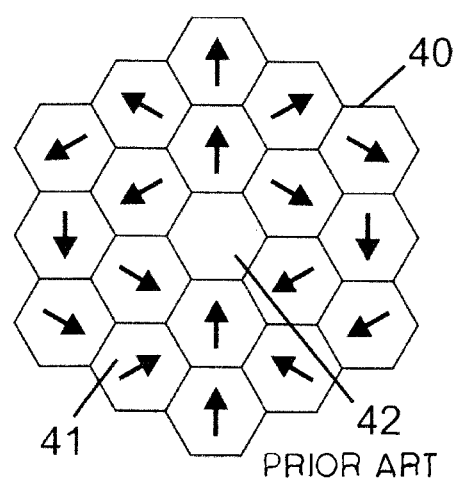
Figure 3A:
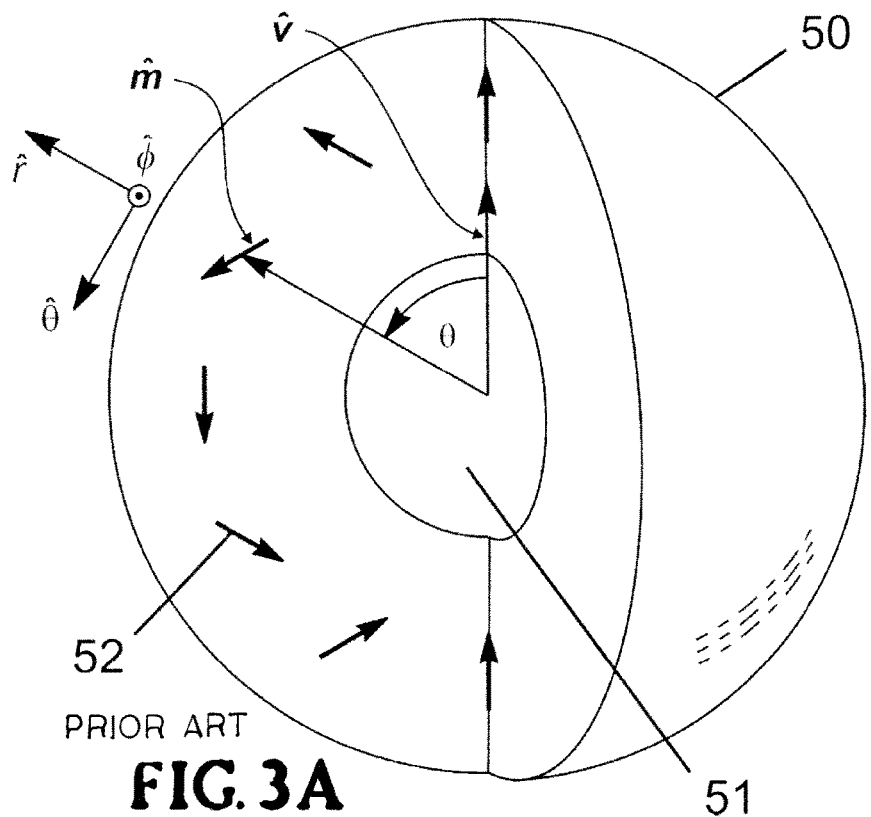
FIG. 3A depicts an idealized magnetization scheme for a Halbach sphere.
Figure 3B:
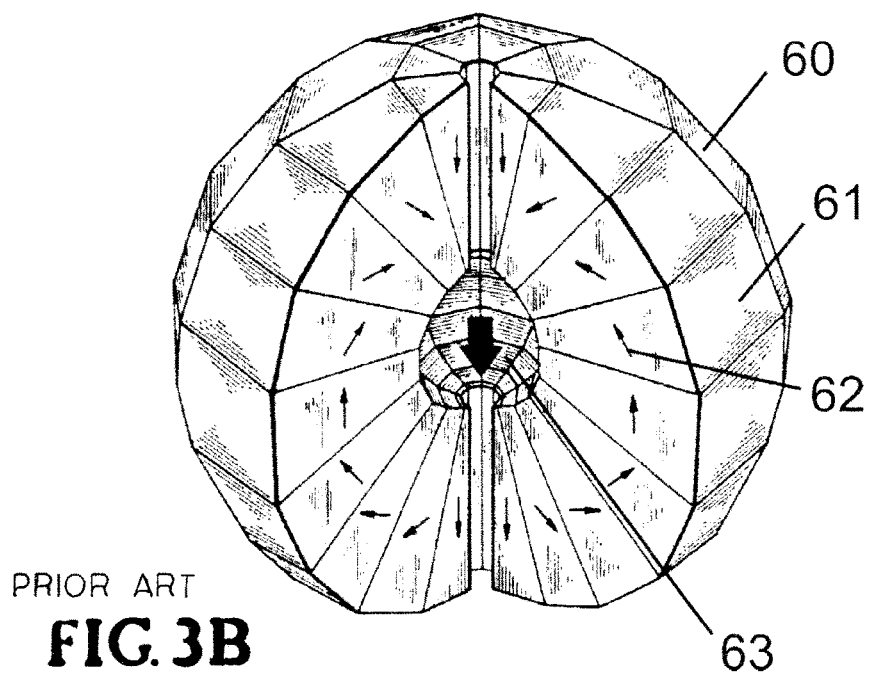
FIG. 3B shows a practical embodiment of a Halbach sphere.

In this disclosure, the recitation of a specified number of elements is understood to include the possibility of any greater number of such elements. Thus, for example, the recitation that a magnet array, or a layer of a magnet array, comprises two magnets indicates that the array or layer comprises at least two magnets, but may comprise 3, 4, 5 or any number of magnets greater than two. Similarly, reference to individual ones of a group of elements indicates that any single one or more than one of such elements has the specified property or characteristic. The term "or" is inclusive rather than exclusive, and a statement indicating one characteristic "or" another will be understood to include the possibility of both characteristics being present. In other words the phrase "A or B" will be understood to contemplate the presence of both of characteristics A and B.

In this disclosure the term "magnetic resonance" or "MR" means resonant reorientation of magnetic moments of a sample in a magnetic field or fields, and includes nuclear magnetic resonance (NMR), electron spin resonance (ESR), magnetic resonance imaging (MRI) and ferromagnetic resonance (FMR). Embodiments may also be applied in ion cyclotron resonance (ICR). In particular applications and embodiments the apparatuses and methods disclosed are applied to NMR and in embodiments they are applied to NMR spectrometers or to NMR imagers. Materials that display magnetic resonance when exposed to a magnetic field are referred to as magnetically resonant or MR active nuclides or materials.

In this disclosure the term "shimming" refers to any method for suppressing a magnetic field inhomogeneity or otherwise modulating an aspect of the field. In particular embodiments the magnetic field is a primary magnetic field and is generated or maintained within a magnetic resonance device. In embodiments this is an NMR machine, is a spectrometer or is a compact NMR machine. In particular embodiments shimming is achieved by movement of selected magnets or shimming elements positioned at selected locations within a magnet array or within the lattice configuration of a magnet array. Shimming may also be achieved, in embodiments that comprise electronic current paths included in the design for this purpose, by modulating currents thereon under the control of a shimming algorithm. In order specifically to distinguish between such shimming and the shimming described above achieved by moving selected magnets, the term "electronic shimming" is used to indicate the use of modulated electronic currents.

In this disclosure the term "primary magnet" refers to one of the magnets forming part of a magnet array or contributing to a primary magnetic field for use in magnetic resonance applications. In embodiments there are two or more such primary magnets comprised in a magnet array and the homogeneity of the overall field generated by a magnet array (referred to as the "primary field") therebetween may be modulated or improved by the use of shimming techniques. Possible configurations and magnet geometries for embodiments of magnet arrays and their component primary magnets are further described herein. By way of example and not limitation, FIGS. 6A through 10A show possible arrangements of magnets according to an example of a first series of embodiments and in embodiments magnets may be truncated cubes.

In this disclosure the term "shimming magnet" or "shimming block" refers to a magnet or other structure within or associated with a magnet array and useable to shim a magnetic field associated with the array. For example, in the magnet array illustrated in FIGS. 6A through 10A it will be seen that certain layers contain a number of shimming magnets or shim locations 120. It will be understood that in alternative embodiments different numbers of such shimming magnets may be used, their locations may be adjusted, and they may be positioned within or outside of the magnet array. In the embodiment illustrated the shimming magnets may be controllably moved to modulate the field, and it will therefore be understood that in such a case the shimming magnets are sized to permit such movement.

In this disclosure the term "pole piece" refers to a piece of magnetically permeable material placed in the vicinity of primary magnets for use in contributing to or shaping the primary magnetic field. In embodiments pole pieces are made of any suitable material and design, all of which will be readily understood, selected from and implemented by those skilled in the art. By way of example and not limitation, in embodiments pole pieces are made from Hiperco™ or soft iron materials. It will be understood that in embodiments pole pieces may be applied to multiple pairs of opposed magnet faces and that in embodiments pole pieces may comprise shim paths to carry shim currents controllable by a user.

In this disclosure the terms "primary field", "main field", "primary magnetic field" and "main magnetic field" mean the magnetic field generated by a magnet array. In embodiments the array is comprised in a magnetic resonance apparatus. In one series of embodiments a field strength in the range of 1.0 to 2.5 Tesla is achieved, however the field strength will depend on the number of layers of lattice sites, the strength of the individual component magnets, the presence or absence and types of pole piece and construction materials used and other variables. Those skilled in the art will understand all such variables and their causes and effects and make suitable allowances therefor.

In alternative embodiments field strengths of up to or less than or about 0.1, 0.2, 0.3, 0.4, 0.5, 0.6, 0.7, 0.8, 0.9, 1.0, 1.1, 1.2, 1.3, 1.4, 1.5, 1.6, 1.7, 1.8, 1.9, 2.0, 2.1, 2.2, 2.3, 2.4, 2.5 or more will be generated. It will be understood that the field in the testing volume will depend on many variables including the number of lattice layers used, the nature of the primary magnets, any pole piece materials used and other variables all of which will be readily identified by those skilled in the art. In particular embodiments the primary field will be between about 1.0 and 2.5 Tesla. In particular embodiments the magnetic primary magnetic field of an array or the magnetic field within the testing volume is between about 0.1 and 2.5 Tesla, between 1.0 and 2.5 Tesla, between about 1.2 and 2.3 Tesla, or between about 1.5 and 2.0 Tesla.

In this disclosure, a "testing volume" refers to a cavity within a magnet array that is designated to hold a sample under test. In embodiments, a testing volume is located at a lattice point within a lattice configuration and in embodiments contains within it other materials or susbsystems comprised within the apparatus associated with the magnet assembly, such as shimming means, means to hold or to rotate a sample or to modulate or maintain its temperature or other physical characteristics, means to apply field gradients, or means to apply or detect pulsed or transient magnetic fields. Other possible adaptations will be apparent to those skilled in the art.

In this disclosure a reference to "modulating" a magnetic field or an inhomogeneity that may be comprised therein, refers to imposing one or more desired constraints on the configuration of the field at any point in space. Thus modulating refers generally to the achievement of a desired change.

In this disclosure "suppressing" an inhomogeneity refers to any adjustment to the geometric components of a magnetic field to correct or smooth out or otherwise overcome undesired irregularities or distortions in the field.

In this disclosure the term "geometry" when used with reference to a shim path, shim current, magnetic field or the like, refers to both the spatial arrangement of components and to the overall position of the structure under consideration.

In this disclosure, the term "lattice" means a regular array of points in space, each of which is displaced from an origin by a sum of integer multiples of vectors, the vectors together constituting a 3-dimensional basis. In this disclosure the term "3-dimensional basis" means a set of three vectors $\{\vec{u}, \vec{v}, \vec{w}\}$ such that $$a\vec{u}+b\vec{v}+c\vec{w}=0$$

implies that a, b, and c are all identically zero. In the art, such a set of vectors is said to be linearly independent.

Figure 4A:
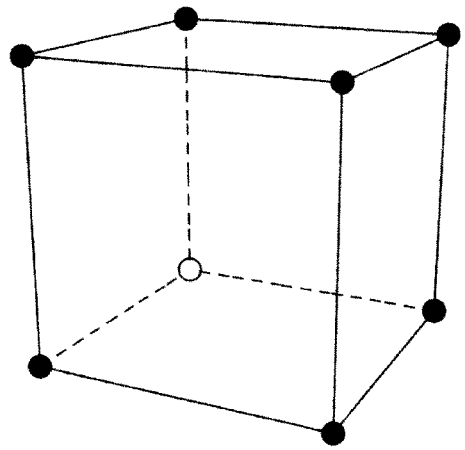
FIGS. 4A-4D show unit cells of example point lattices.
Figure 4B:
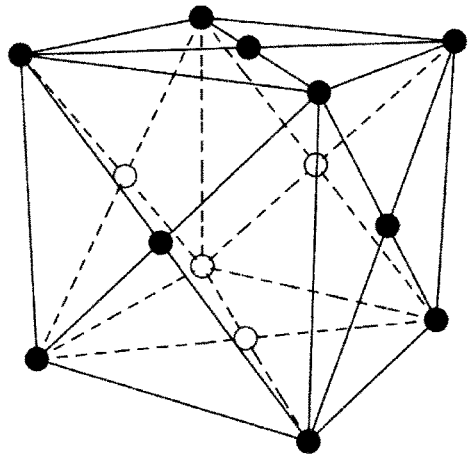
Figure 4C:
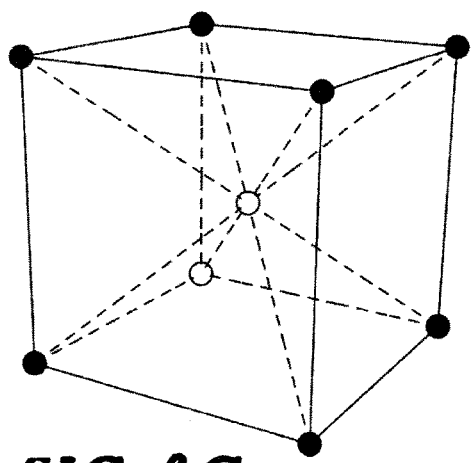
Figure 4D:
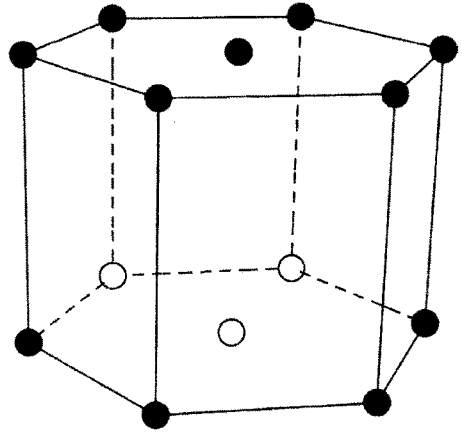

A lattice can be visualized in terms of repeats of its unit cell, the smallest volume of the repeat pattern that can be used to construct the whole lattice. Illustrative examples of possible lattices are the simple cubic lattice; the face-centered cubic lattice; the body-centered cubic lattice; and hexagonal lattices such as the simple hexagonal or hexagonal close-packed lattices. The foregoing are illustrated in FIGS. 4A through 4D, namely: simple cubic lattice (FIG. 4A); face-centered cubic lattice (FIG. 4B); body-centered cubic lattice (FIG. 4C); simple hexagonal lattice (FIG. 4D).

In further embodiments, a lattice may be a distorted version of one of the foregoing lattice types, such as a simple tetragonal lattice, which is a simple cubic lattice lengthened or shortened along one dimension. Further embodiments incorporate two or more interpenetrating lattices, and without limitation include interpenetrating lattices of the foregoing identified types.

In this disclosure, the term "lattice configuration" or "lattice arrangement" refers to an arrangement of objects wherein individual objects are positioned with their centers substantially coincident with a finite set of points of a lattice. More particularly, where used in reference to a group of magnets or to a magnet array or portion thereof, the term "lattice configuration" or "lattice arrangement" refers to an arrangement wherein individual component magnets are placed with their centers substantially coinciding with a finite set of points defined by a lattice. For the avoidance of doubt and for simplicity, it will be understood that reference to a lattice configuration will necessarily reflect the underlying lattice structure, so that, for example, a Bravais lattice configuration indicates a lattice configuration based on an underlying Bravais lattice. It will be understood that in alternative embodiments a magnet array may be expanded by adding additional magnets according to the underlying lattice pattern, to the extent desired by the user. It will be further understood that in embodiments a single location within the lattice configuration occupied by a first polyhedral magnet may be optionally occupied by a suitably modified first polyhedral magnet or by a plurality of second polyhedral magnets, as desired by a user to suit particular purposes.

In embodiments some of the lattice sites are occupied by composite magnets comprised of smaller second polyhedral magnets, and in embodiments some of the individual second magnets that are comprised in such composite magnets will be omitted to accommodate sample tube entry, one or more sample channels, or other access ports to the interior of the assembly, and in particular to the testing volume. It will be understood that in embodiments this arrangement allows the primary magnetic field to be kept as close as possible to the theoretically ideal field for the magnet array.

In this disclosure the term "magnet array" or "magnet assembly" refers to an arrangement of primary magnets configured to generate a collective magnetic field useable for the applications contemplated herein. In embodiments a magnet array comprises individual primary magnets arranged in a lattice configuration. In selected embodiments, the shapes and locations for individual component magnets substantially fill the volume surrounding a designated central volume or testing volume. In embodiments primary magnets forming a magnet array are unitary magnets or are composite magnets, or include both unitary and composite magnets, and in embodiments are shaped or arranged to provide access to the interior of the array. In embodiments the shapes, sizes and arrangement of the primary magnets avoid numerous, skewed, or asymmetrical shapes with oblique magnetization axes. In embodiments the primary magnets are polyhedral. It will be understood that since a magnet array comprises a lattice configuration of primary magnets, the size of the array may be expanded by simply extending the portion of the lattice occupied by suitable magnets. It will be understood that in embodiments multiple unit cells of the lattice configuration may be occupied by single primary magnets, and that in alternative embodiments a single unit cell may be occupied by a composite primary magnet comprising a number of smaller second polyhedral magnets.

As will be seen from FIGS. 6A through 9B, a magnet array is generally assembled with the assistance of structural frames to hold the component magnets of the array in position. In embodiments each layer of the magnet array is assembled in a frame, and the frames with their accompanying magnets are then assembled to form the array. Suitable materials for such a frame in particular embodiments will generally be non-magnetic and by way of example in embodiments such frames are made from aluminum, brass, or a strong plastic such as PEEK™ or Delrin™, or a ceramic material such as Macor™. Those skilled in the art will readily identify and implement a range of possible alternatives.

For convenience, it may be desirable to have only a small number of different types of primary magnets, each magnetized in a way (for example, normal to a flat face) that is straightforward to subject to rigorous and economical quality-control procedures. In embodiments it may also be desirable to have design principles that permit incorporation of one or more sample channels or access points into a central volume or testing volume within the magnet array. Thus in embodiments, magnets are constructed to be certain polyhedra that, used in combination, substantially fill the space surrounding a central volume, and are positioned on portions of a regular or slightly distorted point-lattice, such as a simple cubic, face-centered cubic, body-centered cubic, or hexagonal lattice. In embodiments symmetry is exploited in order to keep the number of separate component part types to a minimum.

Figure 12A:
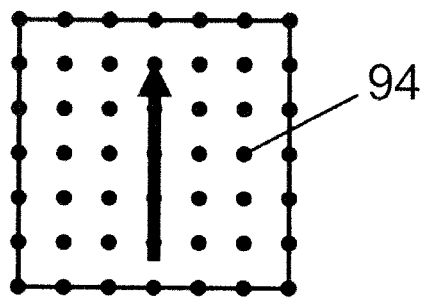
FIGS. 12A through 12C show possible primary magnetic field orientations within a generally cubic magnet array.
Figure 12B:
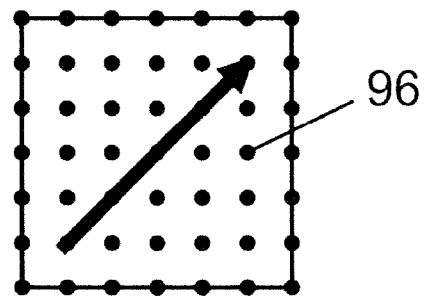
Figure 12C:
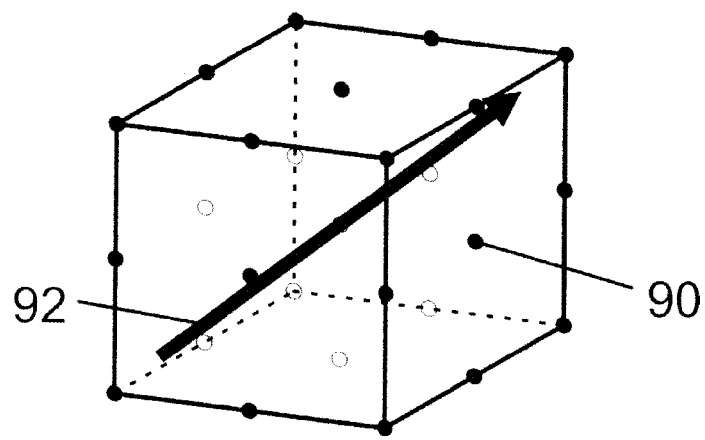

Within a magnet array based on a cubic lattice configuration three preferred axes or directions for a magnetic field exist among the infinity of possibilities for such a direction. These are illustrated in FIGS. 12A through 12C and are shown schematically. In this disclosure where the magnet array is generally cubic the term "body diagonal" refers to a straight line or axis of symmetry of a magnet array that extends between geometrically opposed corners of the magnet array and through the center point of the array. This direction is illustrated by an arrow 92 within a portion of the simple cubic lattice 90 in FIG. 12C. The term "face normal axis" refers to a straight line or axis of symmetry that passes through opposed face centers of a magnet array and through the center point of the array, as shown in a side view 94 of a simple cubic lattice in FIG. 12A. The term "face diagonal" refers to a straight line or axis of symmetry that passes through opposed edge midpoints of a magnet array and through the center point of the array as shown in the side view 96 of the simple cubic lattice in FIG. 12B. In formal terminology associated with cubic lattices, for example in crystallography and solid state physics, the body diagonal, face normal, and face diagonal directions are called the (111), (100), and (110) axes, respectively.

In this disclosure the term "sample rotator" means a device or means for rotating a sample to be tested within the testing volume. Those skilled in the art will recognize a wide range of conventional means for introducing, removing and rotating samples of all kinds and will readily implement and adjust such means to suit particular purposes.

In this disclosure, the term "polyhedron" means a solid comprising substantially flat faces and the term "polyhedral magnet" refers to a magnet having a polyhedral shape. It will be seen that in embodiments pluralities of individual polyhedral magnets are arranged to form a magnet array. In embodiments polyhedral shapes may be distorted, such as, by way of example and not limitation, square parallelepipeds. In particular embodiments polyhedra are selected from the following possibilities: chamfered polyhedron; truncated polyhedron (including in preferred embodiments a truncated cube); rhombic dodecahedron; Platonic solid, Archimedean solid, or Johnson solid. A Platonic solid—also commonly referred to as a regular polyhedron—has identical vertices and has congruent faces, each of which is a regular polygon. An Archimedean solid—also commonly referred to as a semi-regular polyhedron—is a polyhedron that has vertices that are identical. A Johnson solid has regular polygonal faces but inequivalent vertices. In embodiments magnets also comprise spherical or circular-cylindrical magnets and in embodiments these are located at lattice points.

In embodiments a magnet array is assembled from a plurality of polyhedral magnets. In embodiments all of the polyhedral magnets comprised in an array are of the same shape. In embodiments the polyhedral magnets forming an array are of the same size. In alternative embodiments the polyhedral magnets forming an array are of different sizes or of different shapes or of different shapes and different sizes. In embodiments magnets are unitary or are composite or include both unitary and composite magnets.

Figure 5A:
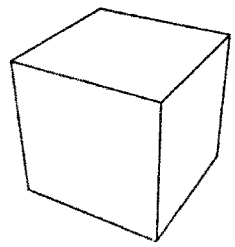
FIGS. 5A-5N show examples of polyhedral shapes.
Figure 5B:
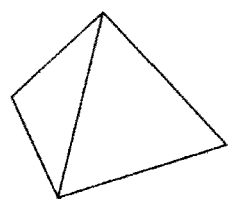
Figure 5C:
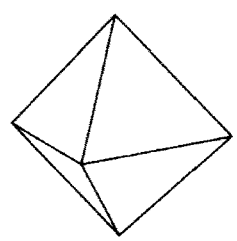
Figure 5D:
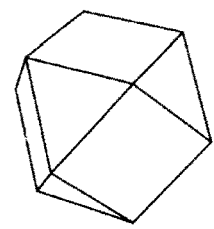
Figure 5E:
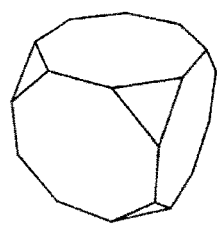
Figure 5F:
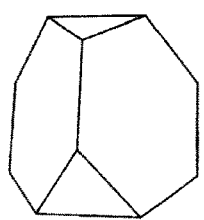
Figure 5G:
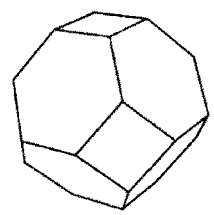
Figure 5H:
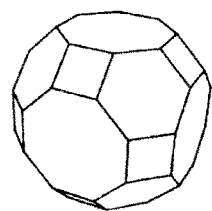
Figure 5I:
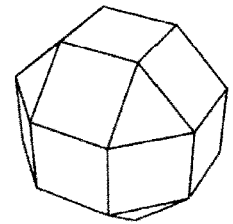
Figure 5J:
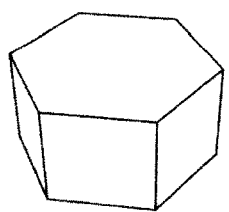
Figure 5K:
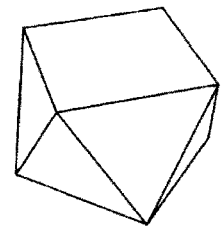
Figure 5L:
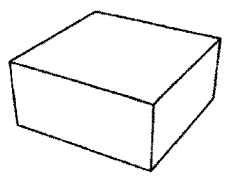
Figure 5M:
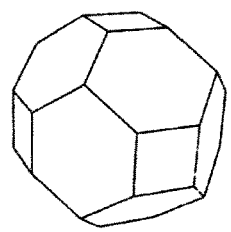
Figure 5N:
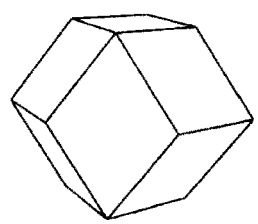

FIGS. 5A-5N illustrate a number of polyhedral shapes all of which are contemplated in alternative embodiments of polyhedral magnets, namely: cube (FIG. 5A); tetrahedron (FIG. 5B); octahedron (FIG. 5C); cuboctahedron (FIG. 5D); truncated cube (FIG. 5E); truncated tetrahedron (FIG. 5F); truncated octahedron (FIG. 5G); truncated cuboctahedron (great rhombicuboctahedron) (FIG. 5H); small rhombicuboctahedron (FIG. 5I); hexagonal prism (FIG. 5J); square antiprism (FIG. 5K); square parallelepiped (square prism) (FIG. 5L); chamfered cube (FIG. 5M); rhombic dodecahedron (FIG. 5N). It will be understood that these possibilities are merely illustrative of a much wider range of potential polyhedral shapes and are in no way limiting. It will be understood that references to any polyhedra also contemplate and include shapes that are derived from the named polyhedron by rounding or chamfering of edges, by drilling holes, or distorting the dimensions along an axis, or in a variety of other ways readily understood by those skilled in the art. It will be understood that in embodiments the truncation or chamfering or general shape of the packed polyhedral magnets will leave spaces useable to form or partly form channels or openings.

In this disclosure the terms "first polyhedral magnets" and "second polyhedral magnets" mean classes of polyhedral magnets that differ in shape or in size, or that differ in shape and size. Generally the overall geometry of the magnet array will be best described or understood in terms of the assembly of such first magnets which will generally be primary magnets. The term second polyhedral magnets is used to indicate polyhedral magnets that are substantially smaller than the first polyhedral magnets and in embodiments such secondary magnets are used to form sample channels in the magnet array or to fill spaces in the array or extend the array. By way of illustration and not limitation, where a magnet array is an array of truncated cubes then in embodiments the secondary polyhedral magnets of the array will have a diameter that allows a plurality of such second polyhedral magnets to be packed to occupy a space substantially equivalent to a first magnet. Those skilled in the art will understand that in embodiments such arrangement allows multiple secondary magnets to be packed into a space left by a missing first magnet, and allows for the provision of openings such as a sample channel within the magnet array, while substantially preserving the continuity of the lattice configuration. Thus in embodiments pluralities of the second magnets are packed to form composite magnets generally equal in size to ones of the larger first magnets and in embodiments such second magnets are arranged to leave spaces therebetween.

Magnets according to particular embodiments are made from or comprise any suitable materials all of which will be readily identified and used by those skilled in the art. By way of example and not limitation, in embodiments magnets will be or comprise high coercivity materials. In embodiments magnets are rare-earth based magnets. Again by way of example and not of limitation, possibilities are neodymium-iron-boron and samarium-cobalt alloys. Those skilled in the art will readily identify and implement a range of possible alternatives.

In particular embodiments individual primary magnets have a diameter of up to, less than, or about 0.1, 0.2, 0.3, 0.4, 0.5, 0.6, 0.7, 0.8, 0.9, 1.0, 1.1, 1.2, 1.3, 1.4, 1.5, 1.6, 1.7, 1.8, 1.9, 2.0, 2.1, 2.2, 2.3, 2.4, 2.5, 2.6, 2.7, 2.8, 2.9, 3.0, 3.1, 3.2, 3.3, 3.4, 3.5, 3.6, 3.7, 3.8, 3.9, 4.0 or more inches. It will be understood that where an array comprises a mixture of larger first magnets and smaller second magnets, then the component second magnets forming composite magnets comprised in a magnet array will be suitable increments or portions of the size of the larger first magnets making up the array. In particular embodiments the truncated cubic primary magnets or first magnets are about 1.25 inches face to face. In embodiments the second magnets which comprise composite magnets of such an array are about 0.50 inches face to face.

In this disclosure the term "magnetic field axis" or "field axis" or "magnetic field direction" or "field direction" where used with reference to a magnet array means an axis or direction relative to the coordinate frame of a lattice configuration of magnets that will serve as the desired orientation of a uniform field within the central cavity or testing volume of the magnet array. This direction can be selected arbitrarily in principle, but in practice it is often desirable to exploit the symmetry of the lattice and the magnets and to select certain special directions that are related to symmetry elements such as the fourfold or threefold symmetry axes of a cubic unit cell. It will be understood that where the context dictates the foregoing terms may be used to describe the field generated by a single magnet or single composite magnet comprised in an array. In cases where the desired magnetic field configuration expressly includes a field gradient, the term "gradient axes" will be used to denote gradient tensor components, or principal components or other directional quantities defining the desired field configuration.

In embodiments, the primary magnetic fields of magnet arrays disclosed herein approximate the field generated by a Halbach sphere. Possible magnetic field directions for a generally cubic magnet array include: a direction normal to a face of the lattice's unit cell; a direction along the line joining the center of the lattice's unit cell to the midpoint of an edge; a direction along a body diagonal of the lattice's unit cell as shown schematically in FIGS. 12A through 12C and further explained elsewhere herein.

Figure 10A:
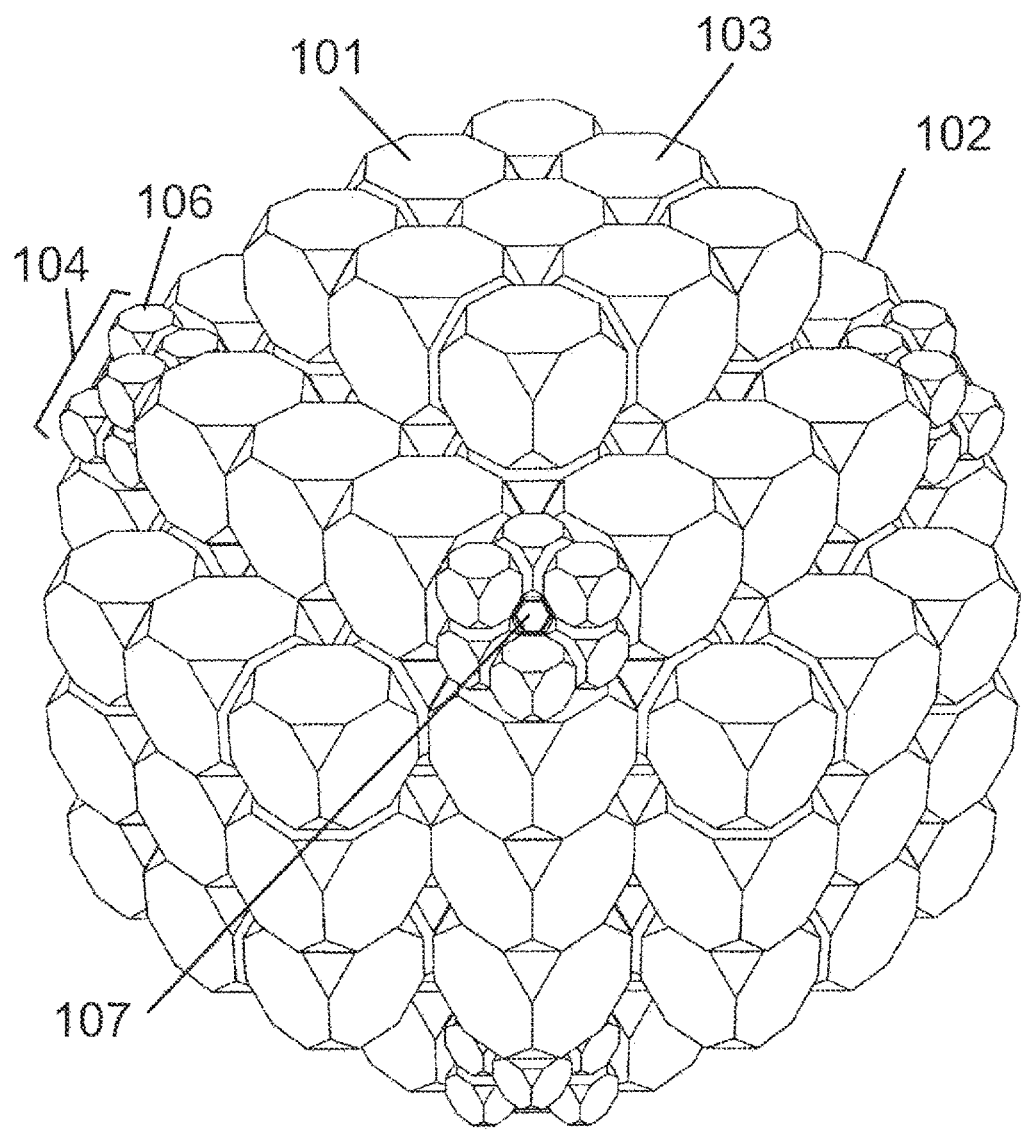
FIG. 10A is a corner view of an array assembled from the layers of FIGS. 6A through 9B showing the location of a possible sample channel.

In this disclosure the term "sample channel" means an opening in a magnet array useable to access the testing volume, for example to introduce a sample to the testing volume, or to remove a sample therefrom. In particular embodiments a sample channel will have any desired orientation and by way of example and not limitation in embodiments a sample channel may extend from a face, corner or edge of a magnet array as is illustrated in FIG. 10A. In embodiments a sample channel is defined at least in part by the positioning of second magnets having reduced size or different geometry from the other first magnets making up the array. In embodiments a sample may be introduced in a suitable sample tube. By way of example and not limitation, a sample tube can be a long glass tube containing a liquid sample, a flow tube, or a small "rotor"-type tube common in solid-state nuclear magnetic resonance (NMR). A variety of possibilities will be readily recognized and implemented by those skilled in the art.

Once the magnetic field direction is established and the magnetization axes of the individual component magnets are calculated, the axis along which a sample tube is to be inserted can be chosen. As with the magnetic field axis, full exploitation of symmetry can select certain directions as preferable from among the infinity of possibilities for a sample-tube entry axis, and some of these are listed below. Other considerations may be material to the choice of the sample channel axis. For example, a particularly useful combination of magnetic field direction and sample tube entry axis is to have the magnetic field direction be normal to a face of a cubic lattice's unit cell and to have the sample tube's entry axis be along the body diagonal. In that case, the angle between these axes is $\cos^{-1}\sqrt{1/3} \approx 54.7°$, the so-called "magic angle" known to practitioners of solid-state NMR. Rapid rotation of a sample around this axis is known to permit use of certain very useful experimental techniques.

Once an axis for a sample channel is chosen, at least three construction methods are contemplated that will permit a sample or a sample tube to be introduced into the central cavity or testing volume of the magnet array. In alternative embodiments the possibilities include but are not limited to: expanding the lattice to put space between the component magnets; drilling holes through the magnets, which may optionally be carried out in symmetric patterns; and leaving out symmetrically disposed subsets of the magnets or subsets of the component second magnets that make up one or more of the composite magnets. In embodiments the foregoing possibilities may be combined in ways readily understood by those skilled in the art.

First Embodiment

A first series of embodiments is described with general reference to FIGS. 6A through 10A and a more detailed explanation of an example of the first series of embodiments is presented below.

In broad aspect there is disclosed a magnet array comprising a plurality of polyhedral magnets arranged in a lattice configuration. In embodiments the magnet array has an associated magnetic field with a designated field direction $\hat{v}$. In embodiments the magnet array at least partly encloses a testing volume and in embodiments completely or almost completely encloses the testing volume. In embodiments the magnetization direction $\hat{m}$ of an individual polyhedral magnet located at a displacement vector $\vec{r}$ from an origin point in the testing volume is determined by the formula:

$$\hat{m}=(2(\hat{v}\cdot\vec{r})\vec{r}-(\vec{r}\cdot\vec{r})\hat{v})/\vec{r}\cdot\vec{r}.$$

In embodiments the polyhedral magnets 101 are truncated cubes, and the magnet array is based on a simple cubic lattice, as illustrated in FIG. 10A.

The first embodiment also comprises a method for generating a magnetic field having a field direction $\hat{v}$. The method comprises providing an array of polyhedral magnets in a lattice configuration, wherein the magnetization direction $\hat{m}$ of an individual polyhedral magnet located at a displacement vector $\vec{r}$ from an origin point is determined by the formula:

$$\hat{m}=(2(\hat{v}\cdot\vec{r})\vec{r}-(\vec{r}\cdot\vec{r})\hat{v})/\vec{r}\cdot\vec{r}.$$

It will be understood by one skilled in the art that the foregoing formula is a coordinate-independent representation of the formula:

$$\hat{m}(r,\theta,\phi)=\cos(k\theta)\hat{r}+\sin(k\theta)\hat{\theta}$$

for the case k=1, suitable for producing a substantially homogeneous field within the central volume, where the colatitude angle $\theta=\cos^{-1}(\hat{v}\cdot\vec{r})$ is defined with respect to the selected field direction $\hat{v}$.

In variants of the first embodiment individual ones of the polyhedral magnets are selected from the group consisting of: a truncated cube; a rhombic dodecahedron; a Platonic solid; an Archimedean solid; a Johnson solid; a chamfered polyhedron; and a truncated polyhedron. Further possible variant shapes are explained elsewhere herein and those skilled in the art will readily identify additional possible shapes, all of which are contemplated in one or more possible embodiments of the subject matter disclosed and claimed herein.

In embodiments the lattice upon which the array is based is a Bravais lattice and thus the magnets of the array have a Bravais lattice configuration. In further embodiments the lattice is a simple cubic lattice, a body centered cubic lattice, a face centered cubic lattice, or a hexagonal lattice and the lattice configuration of the magnets of the array follows such underlying lattice structure.

In one example of the first embodiment, as illustrated in particular in FIGS. 6A through 10A, the polyhedral magnets making up the array comprise pluralities of first 101 and second 106 polyhedral magnets, the second polyhedral magnets being smaller than the first polyhedral magnets. In one embodiment of this configuration, as illustrated in perspective view in FIG. 10A a plurality of the second polyhedral magnets at least partly define a sample channel 107. As will be apparent, in the illustrated embodiment the sample channel is oriented along a body diagonal of the lattice defining the magnet array. This orientation is particularly suited to an array comprised of truncated cubes. It will be understood that with suitable adjustments other orientations are possible and will vary depending on the type of lattice used to construct the array.

In embodiments of the first embodiment direction $\hat{v}$ of the magnetic field corresponds to a body diagonal of the magnet array, a face normal axis of the magnet array, or a face diagonal of the magnet array. These general orientations will be seen in the schematic drawings of FIGS. 12A through 12C.

Figure 11A:
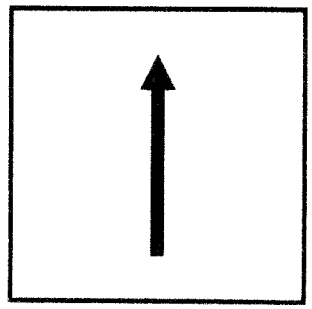
FIGS. 11A through 11C show possible magnetic dipole orientations for individual cubic magnets.
Figure 11B:
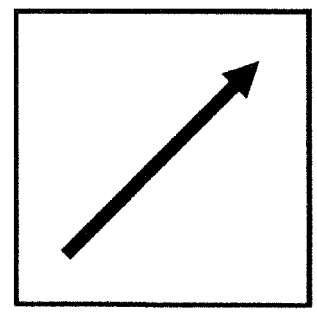
Figure 11C:
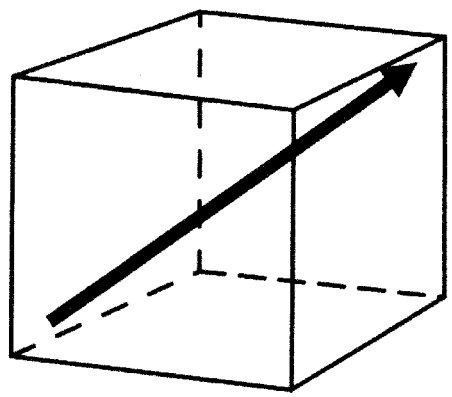

It will be understood that in embodiments individual ones of the first polyhedral magnets have a magnetization direction fit selected from a finite set of possible values compatible with the array having the desired magnetic field direction V. Thus following suitable calculations a user will identify a series of possible values for fit, and will readily determine amongst them which of such values will provide the closest fit to the desired magnetic field direction fit and will select suitable values accordingly. It will be understood that in embodiments the configurations contemplated herein will allow the generation of a suitable primary magnetic field using only a relatively small number of alternative component primary magnet types. For example, the required magnetization directions can be approximated efficiently using a set of magnets, each of which itself has one of the three magnetization orientations depicted in FIGS. 11A through 11C. In FIG. 11A, a cubic magnet is depicted, in side view, with its magnetization in the "face-normal" configuration. In FIG. 11B, a cubic magnet is depicted in side view with its magnetization in the "face-diagonal" configuration. In FIG. 11C, a cubic magnet is depicted in perspective view with a "body-diagonal" magnetization. These magnetization terms apply without change to a cubic magnet that is truncated like those used in the lattice configuration of FIG. 10A and also generally to a composite magnet or an array that comprises multiple component magnets.

An individual polyhedral magnet has a finite number of possible orientations within a packed array. In order to facilitate or improve quality-control procedures, or to make them more cost-efficient, it may be desirable to limit the choice of possible magnetizations so that an individual magnet has only a finite number of possible dipole orientations. When assembling a magnet array a user may select from the set of possible orientations that orientation which, in combination with other magnets in the array, will give the best approximation of the desired primary magnetic field. For example a single primary magnet may have a dipole oriented in any of the three directions illustrated in FIGS. 11A through 11C and may be oriented within a lattice with a given face-normal along any one of six directions corresponding to the six faces of the cube, and then may be further oriented in any of four possibilities by rotation around that face normal, giving a finite but large set of possibilities for the magnetization direction. Thus for a cubic array, the array may be assembled using only three components, namely individual magnets having one of the three dipole orientations shown in FIGS. 11A through 11C. It will be understood that the same principle may be applied to a wide range of other polyhedral shapes. It will also be understood that in embodiments or parts of embodiments a single magnet may be a unitary magnet or may be a composite magnet. For clarity, the field associated with a single magnet may also be referred to as a dipole.

In particular embodiments of the magnet array, the array further comprises a sample rotator. In yet further embodiments the arrays of the first embodiment are comprised in a magnetic resonance device.

In embodiments, the shapes of the polyhedra are selected so that, when positioned on a lattice, the polyhedra interlock and substantially fill a volume. In embodiments the shapes are selected and arranged so that the assembly as a whole exhibits high symmetry, and, in particular, so that a limited number of individual magnet designs is required to assemble the array. It will be understood that if a relatively limited number of individual magnet designs is sufficient then the number of different types of component parts is small compared to the number of types of parts that would be present if each magnet were unique in its design.

In embodiments of the first embodiment and other embodiments the array comprises shims, and there are provided methods for shimming the primary magnetic field associated with an array. In embodiments the shimming uses shimming magnets positioned within or around the array. In embodiments the shimming is achieved using electronic shimming structures. In embodiments suitable pole pieces are provided to provide fine shimming of the field.

As will be seen in FIG. 10A some of the magnets 101 comprised in the lattice configuration making up the magnet array 102 are larger first magnets 103 and others are smaller second magnets 106. The smaller second magnets form composite magnets 104 at particular points in the array. As will be seen in FIG. 10A, the use of such smaller second magnets 106 is exploited to provide a sample channel 107, in this case oriented along a body diagonal.

It will be understood that with the individual primary magnets 101 being in the shape of truncated cubes, and the lattice configuration being based on a simple cubic lattice, a magnet array 102 of the embodiment may be formed by forming and positioning individual layers of individual magnets 101.

Figure 6B:
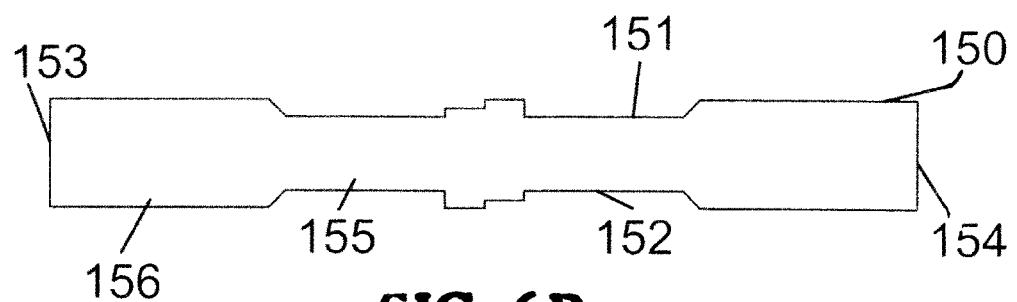
FIG. 6B is an end view of the frame used to hold the zeroth layer according to FIG. 6A.
Figure 6A:
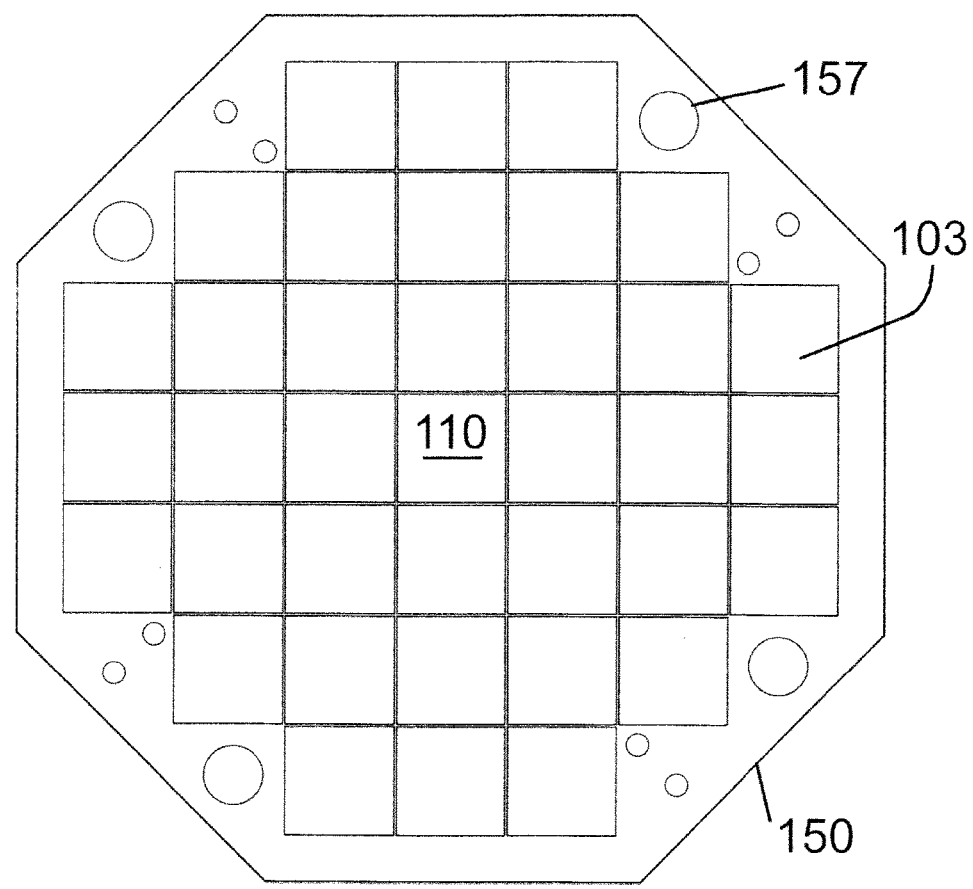
FIG. 6A is a plan view of the zeroth, or central, layer of an example of a first embodiment in its support frame.

Broadly, a central layer is designated Layer 0 and comprises a vacant space 110 at its center, forming the testing volume. FIG. 6A shows a plan view of Layer 0 of the magnet array of a first example of the first embodiment. It will be seen that these magnets are primary magnets and are "first magnets" as explained in the definitions section of the disclosure. Layer 0 is assembled in a support frame 150 having faces 151, 152 and ends 153, 154, shown schematically in cross section in FIG. 6B. It will be appreciated that additional openings will be incorporated as required by a user to provide for wiring and other structures.

Figure 7B:
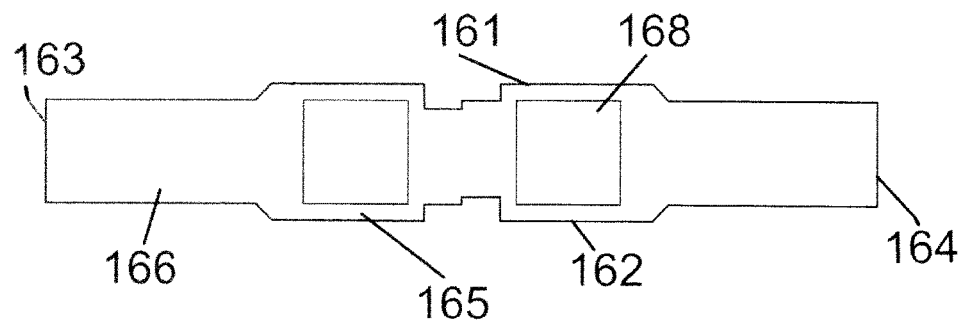
FIG. 7B is an end view of the frame used to hold the first layer according to FIG. 7A.
Figure 7A:
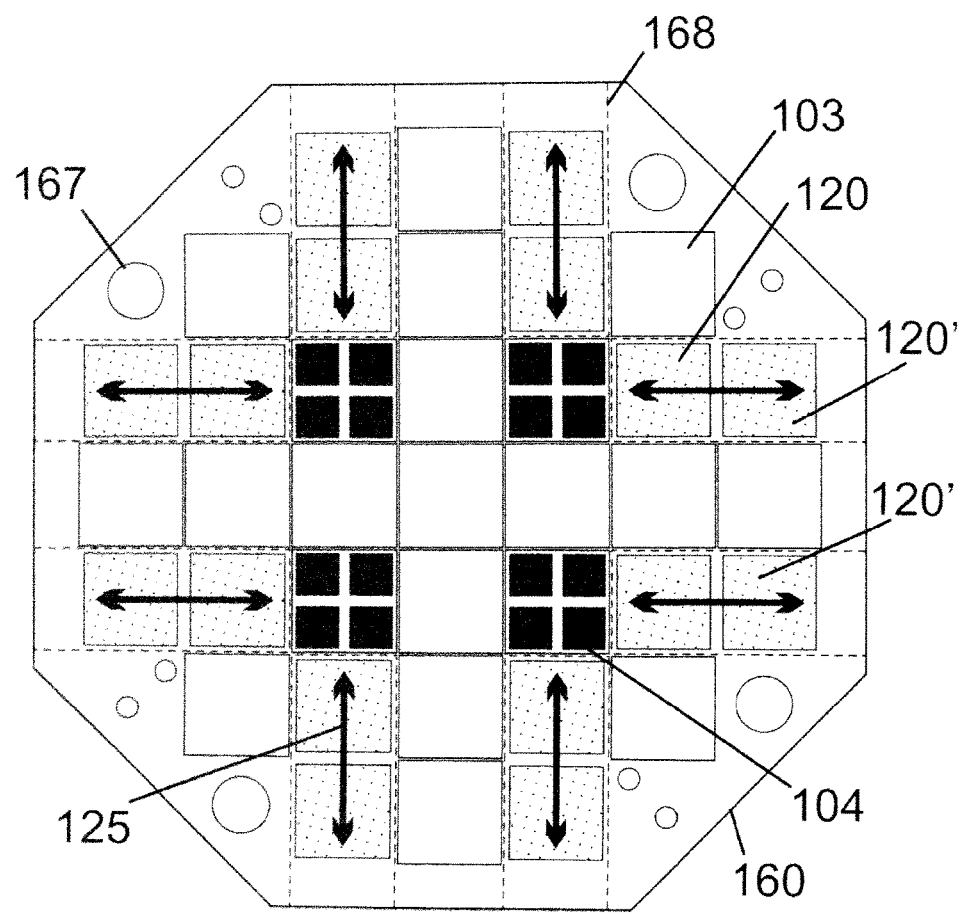
FIG. 7A is a plan view of a first layer of the first embodiment in its support frame.

Layer 0 is bounded on a first side by a Layer 1, followed by a Layer 2, and finally a Layer 3. On the opposite side of Layer 0 the same arrangement extends in the opposite direction, with Layer −1, Layer −2, and Layer −3. It will be understood that the array is generally symmetrical. Each layer is assembled in a frame and the frames will be secured together to form an assembled array 102. Layer 1 is shown in FIGS. 7A and 7B, and it will be seen that the central or testing volume is bounded on all sides and is generally cubic.

In embodiments the magnet array comprises a plurality of shimming magnets 120 associated with the array. In embodiments the shimming magnets occupy positions within lattice configuration and in embodiments are sized to be moveable within the array. In embodiments the shimming magnets 120 are polyhedral and are comprised within the magnet array. In embodiments the shimming magnets are positioned at lattice points within the array, and in embodiments are positioned outside the magnet array. In embodiments the shimming magnets are actuable by a user to move within the magnet assembly.

Individual magnets 101 comprising the magnet array are formed into an ordered arrangement, and the arrangement includes shimming magnets 120, and composite magnets 104 comprising smaller second magnets 106. The shimming magnets 120 are slightly smaller than the other primary magnets 103, etc., permitting them to be moved as desired by a user, in order to effectively adjust the magnetic field in the testing volume. In embodiments, these magnets are individually moveable, or are connected in pairs or in pluralities. In embodiments the shimming magnets move in the plane of the frame. The possible paths of movement in embodiments are designated by arrows, 125. The magnets are mounted in frame 160. Channels 168 in the frame 160 are sized to accommodate shimming magnets 120 and to allow them to be moved.

Figure 8B:
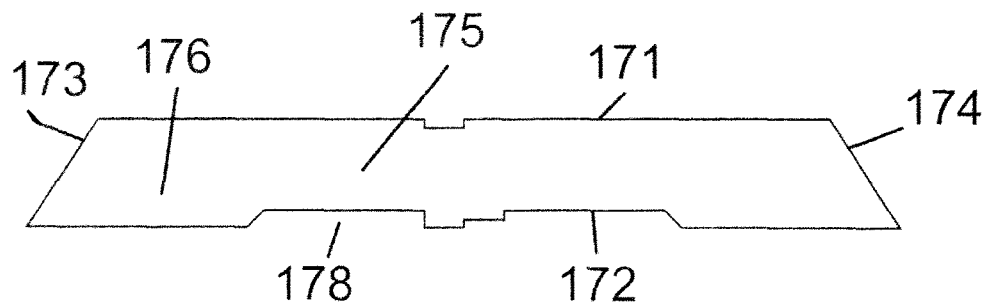
FIG. 8B is an end view of the frame used to hold the second layer according to FIG. 8A.
Figure 8A:
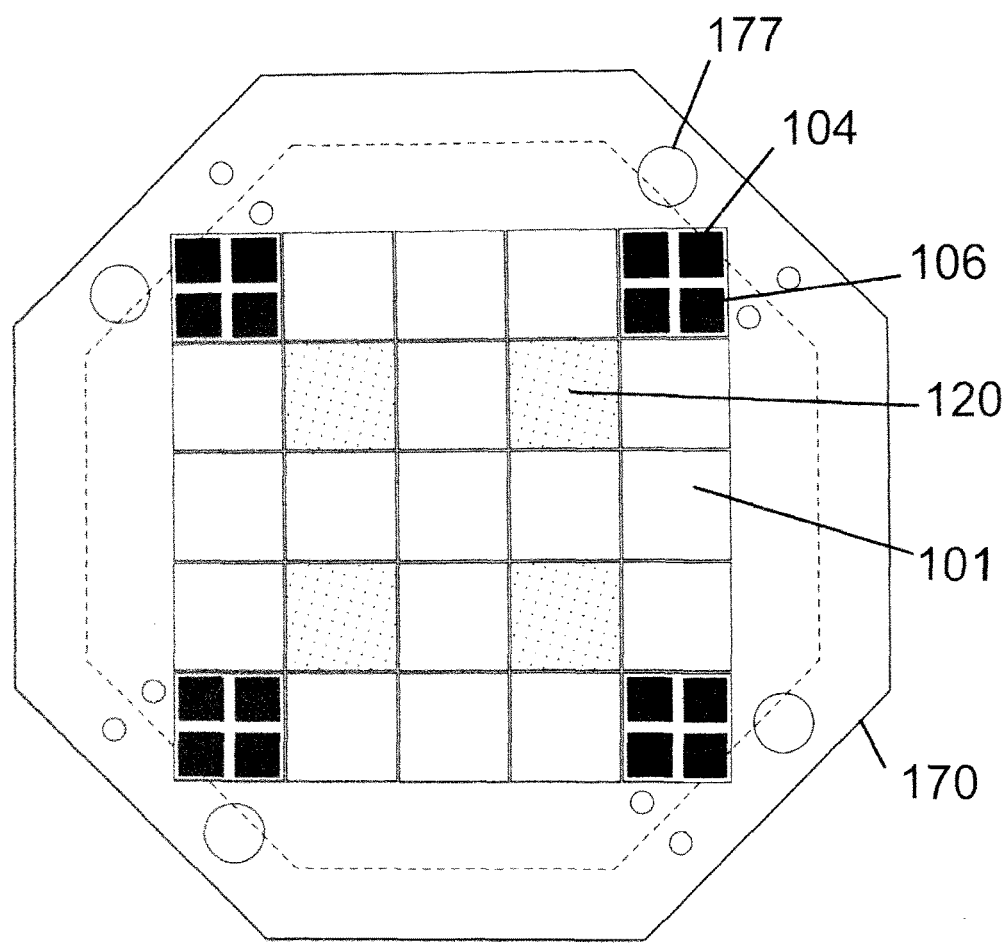
FIG. 8A is a plan view of a second layer of the first embodiment in its support frame.

The structure of Layer 2 is shown in FIGS. 8A and 8B. It will be seen that the arrangement of this layer in an embodiment comprising primary magnets that are truncated cubes is generally a square having five primary magnets 101 along each side. It will be seen that Layer 2 also comprises, at four positions, shimming magnets 120. In embodiments these are related in pairs to corresponding magnets in adjacent layers. Thus in the embodiment illustrated four shimming magnets in Layer 2 are connected in pairs to corresponding magnets in layer 3 of FIGS. 9A and 9B. In these embodiments the pairs of shimming magnets together move into and out of the plane of the figure. It will be appreciated that in the illustrated embodiment, the array comprises seven layers and thus 24 pairs of magnets that are used for shimming. In embodiments shimming magnets or electronic shims are provided in any suitable numbers. In embodiments shimming magnets or electronic shims are generally symmetrically arranged around the testing volume. In embodiments 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48 or more shims or shimming magnets are provided. In embodiments movement of the shimming magnets is coordinated in groups of 1, 2, 3, 4, 5, 6, 7, 8, 9 or more shimming magnets.

In embodiments there is also disclosed a method for shimming a magnetic field generated by the magnet array according to embodiments. Generally, the method comprises one or more steps. In embodiments the steps comprise: a) obtaining a functional representation of the effect of moving the one of the plurality of shimming magnets on the magnetic field; b) repeating step a) for each one of the plurality of shimming magnets; c) deriving a sum function of the results of steps a) and b); and d) monitoring the magnetic field while adjusting the positions of ones of the shimming magnets.

The shimming magnets are provided as one means for "coarse" shimming the magnetic field within the testing volume. In embodiments the procedure for shimming comprises one or more or all of the following steps:

1) Obtain a functional representation of the effect on the magnetic field in the testing volume of moving a given one of the designated pairs of moveable magnets. A suitable functional representation might take the form $\vec{B}_i(x,y,z,\eta_i)$, where x, y, and z denote the position coordinates within the testing volume where the field is to be estimated, and where $\eta_i$ represents a coordinate variable along which shim magnet i is permitted to move controllably. This functional representation can be obtained variously by magnetostatic simulations or by mapping the magnetic field changes that occur, for example with a gaussmeter probe, when magnet i is moved along the coordinate $\eta_i$. Alternative functional representations and means for determining them will be readily understood by those skilled in the art.

2) Combine the functions $\vec{B}_i(x,y,z,\eta_i)$ into a sum function. In embodiments the usefulness of this sum function, as a representative of the effects on the main magnetic field depends in part on the extent to which the individual effects are independent, i. e. on the extent to which the magnetizations of the shim magnets and other magnets are resistant to changes induced by the motions. In embodiments an important physical factor governing this resistance is the coercivity of the magnetic materials used to fabricate both the shim magnets and the other component magnets in the array. It will be appreciated that in embodiments use of high-coercivity magnetic materials is thus preferred.

3) In embodiments the sum function is then decomposed into component functions, in terms of both the spatial variables x, y, z and the magnet-coordinate variables $\eta_i$. Alternatively, in embodiments, the magnet-coordinate variables $\eta_i$ can be combined linearly into new variables $\xi_j$, possibly adapted to the symmetry of the shim-magnet positioning, and the sum function expressed in terms of both the spatial variables x, y, z and the symmetry-adapted variables. Those skilled in the art of shimming will choose functional forms (polynomials, for example) in the spatial variables x, y, z to suit the particular application.

4) In embodiments a response function of the magnetic field within the testing volume is determined. In embodiments this response function might be a magnetic field map or an NMR parameter, such as a resonance line width or may be other functions which will be readily identified and selected amongst by those skilled in the art.

5) In embodiments a use will adjust or will iteratively adjust the positions of the shim magnets, and monitor changes in the response function, until a desired field configuration is achieved. Those skilled in the art of shimming will use improvements noted in the field or line-width data with each iterative change in order to modulate the main magnetic field as desired in applications. It will be understood that shimming magnets may be moved coordinately or separately as desired by a user. Those skilled in the art will readily understand the adjustments that are necessary or desirable to optimize the foregoing adjustments to the shimming magnets.

Those skilled in the art will recognize and implement a variety of ways to achieve each of the foregoing steps.

Returning now to the configuration of parts in FIGS. 8A and 8B, it will be further seen that at each of the corners of this layer there is situated a composite magnet 104 comprising a series of smaller or second magnets 106.

Layer 2 is mounted in a frame 170, having external face 171 and internal face 172, and sloped edges 173, 174. Central region 175 comprises a recessed portion 178 on an internal face 172, and the periphery of the frame is thickened 176. Recessed portion 178 fits snugly with the thickened central portion 165 of frame 160 holding adjacent layer 1. Openings 177 are provided to allow adjacent frames to be mutually secured, for example, with bolts.

Figure 9B:
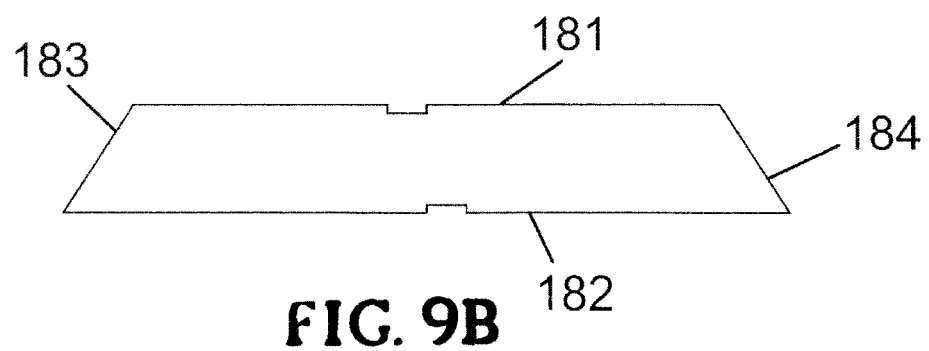
FIG. 9B is an end view of the frame used to hold the layer according to FIG. 9A.
Figure 9A:
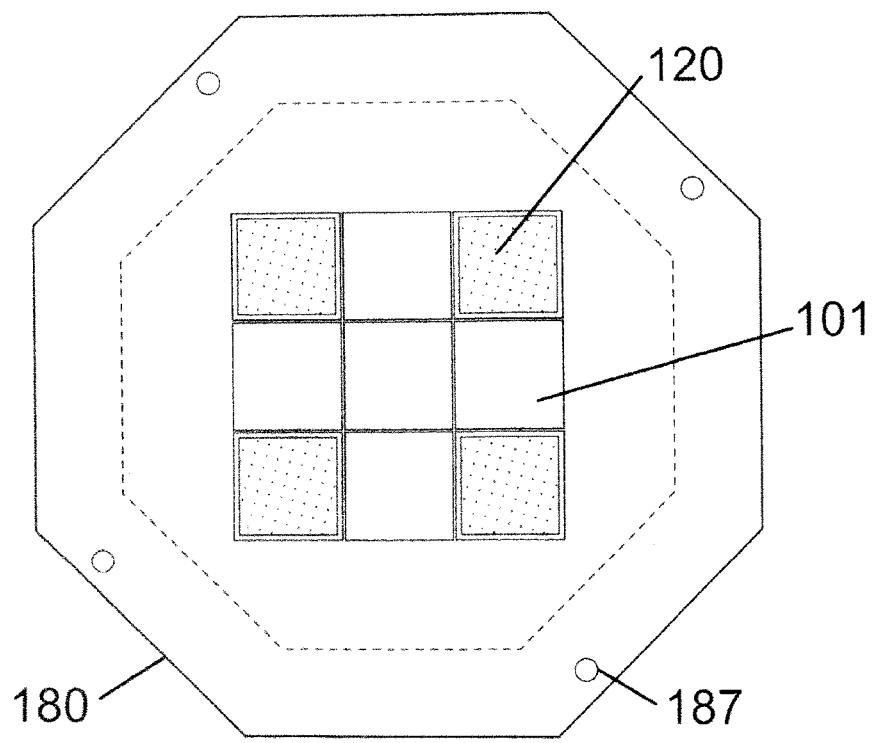
FIG. 9A is a plan view of a third layer of the first embodiment in its support frame.

Layer 3 are shown in plan view in FIG. 9A. It will be seen that Layer 3 is a square with three magnets along each side, comprising central primary magnets 101, and four shimming magnets again designated 120, at its corner positions. Again these shimming magnets are slightly smaller than the other primary magnets and can be moved to shim the primary field. The layer is assembled in frame 180 having sloped edges 183, 184, an outer face 181 and an inner face 182 which will fit snugly with adjacent frame 170. Openings 187 are again provided to allow adjacent frames to be mutually secured.

As will be seen in FIG. 10A, the composite magnet positions comprising composite magnets 104 comprised of secondary magnets 106 allow the formation of a sample channel 107 accessible from a corner of the array.

As indicated above, FIGS. 6A, 7A, 8A, and 9A show magnets in positions constrained by the frame, which is shown in plan view. FIGS. 6B, 7B, 8B, and 9B respectively show cross-sectional end views of the respective frames for the layers illustrated. The framing materials will be selected by a user from a range of suitable materials and in the exemplary embodiment are made of any suitable material.

Openings are provided in the frames as necessary or desirable to accommodate wires, mountings, bolts, screws and the like and to permit access to the array as required by a user. It will be understood that in embodiments both primary and shimming magnets are unitary magnets and in alternative embodiments are composite magnets.

In one embodiment of the first series of embodiments the truncated cubic primary magnets or first magnets are about 1.250 inches face to face. The second magnets, which comprise composite magnets, are about 0.500 inches face to face. As a result the spaces between such smaller magnets will accommodate a 5 mm NMR tube down a space or hole along the body diagonal of the main magnet array. The testing volume of the array is about the same size as one of the larger first or primary magnets. It will be understood that a range of sizes may be used and that the specific ratio of sizes of the first and second magnets will be adjusted by a user to suit particular purposes.

While the first series of embodiments is illustrated and explained with general reference to primary magnets that are truncated cubes and a lattice that is a simple cubic lattice, a variety of other possible structures will be readily understood by those skilled in the art. Some examples of embodiments using different polyhedral shapes are presented below.

A variety of alternative embodiments are possible, and illustrative variants are presented below. It will be understood that these are in no way limiting of the subject matter hereof.

Considerations regarding selectively removing subsets of the magnets, or subsets of the components of composite magnets, chamfering, affixing subsets of magnets to moveable structures in order to provide symmetry-adapted control over selected field-gradient functions, and shimming apply to all manner of alternative embodiments and variant embodiments. The possible variations and their implementation will be readily apparent to those skilled in the art who will select from and implement the illustrative variations and others, to suit particular requirements.

Those skilled in the art will recognize and implement changes to the geometry of frames, patterns of movement of the shimming magnets, any algorithms and calculations used, and any other variables that require adjustment to accommodate changes in the geometry of the array, the lattice structure, the magnets and other requirements. Those skilled in the art will also readily understand and implement modifications of embodiments to incorporate pole pieces and other refinements to further adjust the field in the testing volume.

Example

A first example of the first embodiment is explained with particular reference to FIGS. 6A through 10A and is merely illustrative of embodiments and is in no way limiting of the subject matter claimed herein.

In this exemplary form of the first embodiment generally designated 102 and shown in a perspective view in FIG. 10A the primary magnets 101 are in the shape of truncated cubes. Some are unitary magnets 103 generally referred to herein as first magnets, and others are composite magnets 104 comprising multiple smaller second magnets 106. The truncated cubes are disposed with their centers placed at the points of a simple cubic lattice as shown in FIG. 4A. If the lattice sites are labeled with triads of integers, e. g. [+1,0,0], [1,-2,0] etc., with each member of the triad corresponding to a coordinate of the lattice position according to three mutually perpendicular Cartesian axes, then we designate the lattice site at the center, [0,0,0], as the sample location. This location is vacant, containing no magnet, and constitutes the testing volume, able to contain a sample under study, a detection coil, temperature stabilization or field homogenizing means, a rotating device to spin the sample, and/or such other components as may be desired by a user.

Figure 10B:
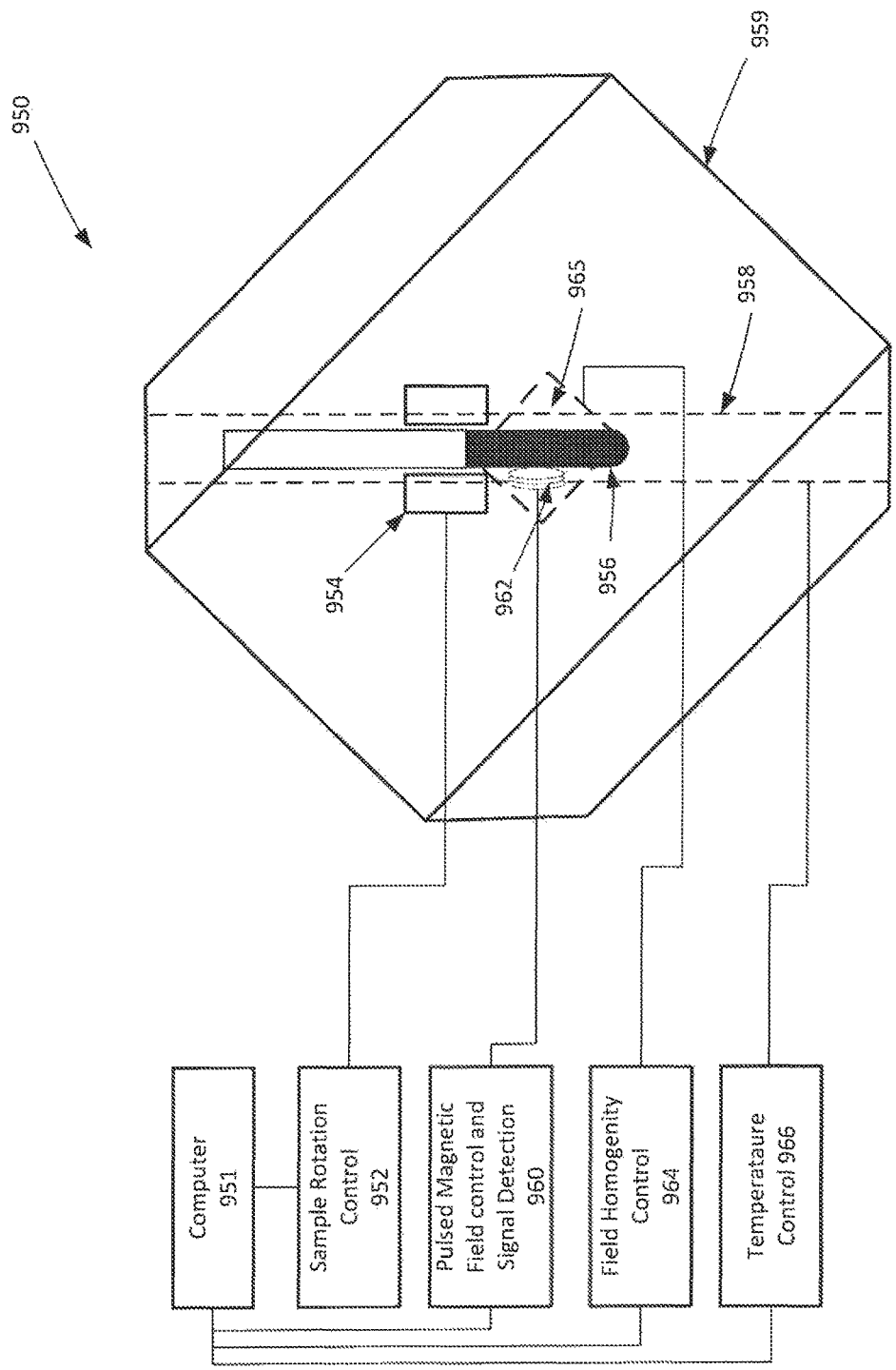
FIG. 10B is a block diagram of an embodiment of a magnetic resonance device in accordance with an embodiment of the invention.

FIG. 10B is an exemplary block diagram of a magnetic resonance device 950 in accordance with an embodiment of the invention. The device 950 comprises a computer 951 operably connected to a sample rotation control module 952 for controlling rotation of an optional sample rotator 954 used for rotating a sample 956 within a channel 958 provided in the magnet assembly/array 959. The computer 951 may also be operably connected to a pulsed magnetic field control and signal detection module 960 used for controlling a detection coil 962 and receiving a signal therefrom. The device 950 may also include a field homogeneity control module 964 for controlling the magnetic field in a centrally located lattice site 965 which is designed as the testing volume. A temperature control module 966 may also be provided for controlling the temperature inside the channel 958.

The magnetization of the magnet at site [x,y,z] may be selected to be the closest unit vector to the idealized magnetization direction $$\hat{m}=(2(\hat{v}\cdot\vec{r})\vec{r}-(\vec{r}\cdot\vec{r})\hat{v})/\vec{r}\cdot\vec{r},$$

consistent with the selection being within the finite set of vectors available by rotating a component magnet into one of the several orientations permitted by the magnet's insertion into the lattice. It will be understood that the position vector $$\vec{r}=a(x\hat{x}+y\hat{y}+z\hat{z})$$

is calculable from the site indices x, y, and z, along the Cartesian axes defining the lattice and the lattice spacing, a. It will be appreciated that the set of these several orientations is made far more numerous by the fact that the component magnets are polyhedra of high symmetry rather than wedges or other oblique shapes. Consequently the array can be constructed using a limited number of component magnet configurations. When assembling a magnet array a user may select from the set of possible orientations that orientation which, in combination with other magnets in the array, will give the best approximation of the desired primary magnetic field. For example a single primary magnet may have a dipole oriented in any of the three directions illustrated in FIGS. 11A through 11C and may be oriented in several different ways within a cubic lattice. Thus for a cubic array, the array may be assembled using only three components, namely individual magnets having one of the three dipole orientations shown in FIGS. 11A through 11C. It will be understood that the same principle may be applied to a wide range of other polyhedral shapes. It will also be understood that in embodiments or parts of embodiments a single magnet may be a unitary magnet or may be a composite magnet.

In this example symmetry is exploited and $\hat{v}$ is preferably oriented along a body diagonal, parallel to a face diagonal, or perpendicular to a face. In particular embodiments the field direction $\hat{v}$ is oriented along a body diagonal of the magnet array and in particular embodiments is oriented perpendicular to a face of the magnet array.

Again for maximum symmetry, the magnets are included in the assembly so that all members of a class are included. For example, the class $\overline{1,0,0}$ includes six magnet sites, namely [1,0,0], [0,1,0], [0,0,1], [-1,0,0], [0,-1,0], and [0,0,-1]. The class $\overline{2,1,0}$ includes 24 magnets corresponding to permutations of the numbers and changes of sign.

As will be seen in FIG. 10A some of the magnets 101 comprised in the lattice configuration making up the magnet array 102 are larger first magnets 103 and others are smaller second magnets 106. The smaller second magnets form composite magnets 104 at particular points in the array. As will be seen in FIG. 10A, the use of such smaller second magnets 106 is exploited to provide a sample channel 107, in this case oriented along a body diagonal.

It will be understood that with the individual primary magnets 101 being in the shape of truncated cubes, and the lattice configuration being based on a simple cubic lattice, a magnet array 102 of the embodiment may be formed by forming and positioning individual layers of individual magnets 101.

Broadly, a central layer is designated Layer 0 and comprises a vacant space 110 at its center, forming the testing volume. FIG. 6A shows a plan view of Layer 0 of the magnet array of a first example of the first embodiment. It will be seen that these magnets are primary magnets and are "first magnets" as explained in the definitions section of the disclosure. Layer 0 is assembled in a support frame 150 having faces 151, 152 and ends 153, 154, shown schematically in cross section in FIG. 6B. As will be seen the frame comprises a thinner central portion 155 and thicker periphery 156 and is generally octagonal. Holes 157 are included in the frame to allow the insertion of bolts screws or other supporting or securing structures. It will be appreciated that additional openings will be incorporated as required by a user to provide for wiring and other structures.

Layer 0 is bounded on a first side by a Layer 1, followed by a Layer 2, and finally a Layer 3. On the opposite side of Layer 0 the same arrangement extends in the opposite direction, with Layer -1, Layer -2, and Layer -3. It will be understood that the array of this example of the embodiment is generally symmetrical. Each layer is assembled in a frame and the frames will be secured together to form an assembled array 102.

Layer 1 is shown in FIGS. 7A and 7B, and it will be seen that inner layers 1 and -1 align with central Layer 0 but lack the central cavity, and thus the central or testing volume is bounded on all sides and is generally cubic.

Individual magnets 101 are formed into an ordered arrangement, and the arrangement includes shimming magnets 120, which are distinguished by stippling, and composite magnets 104 comprising smaller second magnets 106. The shimming magnets 120 are slightly smaller than the other primary magnets 103, etc., permitting them to be moved as desired by a user, in order to effectively adjust the magnetic field in the testing volume. In the embodiment, these magnets are connected in pairs and can be moved in the plane of the frame along paths designated by arrows, 125.

The magnets are mounted in frame 160 having edges 163, 164, top and bottom surfaces 161, 162, a thickened central portion 165 and thinner periphery 166. Channels 168 are sized to accommodate shimming magnets 120 and to allow them to be moved as described herein, to shim the primary magnetic field of the assembled array. It will be appreciated that holes 167 are comprised in the frame to allow adjacent frames to be mutually secured, and that additional openings will be introduced by a user to accommodate wires and the like.

The structure of Layer 2 is shown in FIGS. 8A and 8B. It will be seen that the arrangement of this layer is generally a square having five primary magnets 101 along each side. It will be seen that Layer 2 also comprises, at four positions, shimming magnets 120. These shimming magnets are slightly smaller than the other primary magnets 101, permitting them to be moved as desired by a user, in order to effectively adjust the magnetic field in the testing volume. These four magnets are connected in pairs to corresponding magnets in layer 3 of FIGS. 9A and 9B, and the pairs together move into and out of the plane of the figure. It will be appreciated that the seven layers of an assembled array together comprise 24 pairs of magnets that are used for shimming.

The 24 pairs of moveable magnets in this first embodiment illustrate the potential for "coarse" shimming the magnetic field within the testing volume. A representative procedure for said shimming would proceed in steps as follows:

1) Obtain a functional representation of the effect on the magnetic field in the testing volume of moving a given one of the designated pairs of moveable magnets. A suitable functional representation might take the form $\vec{B}_i(x,y,z,\eta_i)$, where x, y, and z denote the position coordinates within the testing volume where the field is to be estimated, and where $\eta_i$ represents a coordinate variable along which shim magnet i is permitted to move controllably. This functional representation can be obtained variously by magnetostatic simulations or by mapping the magnetic field changes that occur, for example with a gaussmeter probe, when magnet i is moved along the coordinate $\eta_i$.

2) Combine the functions $\vec{B}_i(x,y,z,\eta_i)$ into a sum function. The usefulness of this sum function, as a representative of the effects on the main magnetic field depends in part on the extent to which the individual effects are independent, i. e. on the extent to which the magnetizations of the shim magnets and other magnets are resistant to changes induced by the motions. The principal physical factor governing this resistance is the coercivity of the magnetic materials used to fabricate both the shim magnets and the other component magnets in the array. It will be appreciated that use of high-coercivity magnetic materials is thus preferred.

3) The sum function can then be decomposed into component functions, in terms of both the spatial variables x, y, z and the magnet-coordinate variables $\eta_i$. Alternatively, the magnet-coordinate variables $\eta_i$ can be combined linearly into new variables $\xi_j$, possibly adapted to the symmetry of the shim-magnet positioning, and the sum function expressed in terms of both the spatial variables x, y, z and the symmetry-adapted variables. Those skilled in the art of shimming will choose functional forms (polynomials, for example) in the spatial variables x, y, z to suit the particular application.

4) Measure a response function of the magnetic field to be shimmed within the testing volume. This response function might be a magnetic field map or an NMR parameter, such as a resonance line width.

5) Iteratively adjust the positions of the shim magnets, and monitor changes in the response function, until a desired field configuration is achieved. Those skilled in the art of shimming will use improvements noted in the field or line-width data with each iterative change in order to modulate the main magnetic field as desired in applications. It will be understood that shimming magnets may be moved coordinately or separately as desired by a user.

Returning now to the configuration of parts in FIGS. 8A and 8B, it will be further seen that at each of the corners of this layer there is situated a composite magnet 104 comprising a series of smaller or second magnets 106.

Layer 2 is mounted in a frame 170, having external face 171 and internal face 172, and sloped edges 173, 174. Central region 175 comprises a recessed portion 178 on internal face 172, and the periphery of the frame is thickened 176. Recessed portion 178 fits snugly with the thickened central portion 165 of frame 160 holding adjacent layer 1. Openings 177 are provided to allow adjacent frames to be mutually secured, for example, with bolts.

Layers 3 are shown in plan view in FIG. 9A. It will be seen that Layer 3 is a square with three magnets along each side, comprising central primary magnets 101, and four shimming magnets again designated 120, at its corner positions. Again these shimming magnets are slightly smaller than the other primary magnets and can be moved to shim the primary field. The layer is assembled in frame 180 having sloped edges 183, 184, an outer face 181 and an inner face 182 which will fit snugly with adjacent frame 170. Openings 187 are again provided to allow adjacent frames to be mutually secured.

As will be seen in FIG. 10A, the composite magnet positions comprising composite magnets 104 comprised of secondary magnets 106 allow the formation of a sample channel 107 accessible from a corner of the array.

As indicated above, FIGS. 6A, 7A, 8A, and 9A show magnets in positions constrained by the frame, which is shown in plan view. FIGS. 6B, 7B, 8B, and 9B respectively show cross sectional end views of the respective frames for the layers illustrated. The framing materials will be selected by a user from a range of suitable materials and in the exemplary embodiment are made of any suitable material.

Openings are provided in the frames as necessary or desirable to accommodate wires, mountings, bolts, screws and the like and to permit access to the array as required by a user. In the example both primary and shimming magnets are unitary magnets. In alternative embodiments it will be understood that composite magnets can also be used.

In this example of the first embodiment the truncated cubic primary magnets or first magnets are about 1.250 inches face to face. The second magnets, which comprise composite magnets, are about 0.500 inches face to face. As a result the spaces between such smaller magnets will accommodate a 5 mm NMR tube down a space or hole along the body diagonal of the main magnet array. The testing volume of the array is about the same size as one of the larger first or primary magnets.

In this example of the frames used to support and organize the component magnets are made from any suitable material. Suitable materials in particular applications include aluminum, brass, or a strong plastic such as PEEK™ or Delrin™, or a ceramic material such as Macor™. Those skilled in the art will readily identify and implement a range of possible alternatives.

In this example the magnets themselves are made from any suitable material. High coercivity materials are suitable, as are strong rare-earth based magnets. Exemplary possibilities are neodymium-iron-boron and samarium-cobalt alloys. Those skilled in the art will readily identify and implement a range of possible alternatives.

In embodiments of this example a field in the range of 1.0 to 2.5 Tesla is achievable, however the field strength of any particular embodiment will depend on the number of layers of lattice sites, the strength of the individual component magnets, the presence and types of pole piece and construction materials used and other variables. Those skilled in the art will understand all such variables and make suitable allowances therefore.

Pole pieces are not illustrated being part of the general common knowledge in the art. It will be understood that those skilled in the art may wish to incorporate pole pieces into the array of the example order to further modify the field. In modifications of the example that contain pole pieces incorporated in the array to shim the magnetic field in the testing volume, it has been found that suitable materials for such pole pieces include Hiperco™, soft iron materials, or other suitable materials, all of which will be readily identified and utilized by those skilled in the art.

Second Embodiment

Figure 13A:
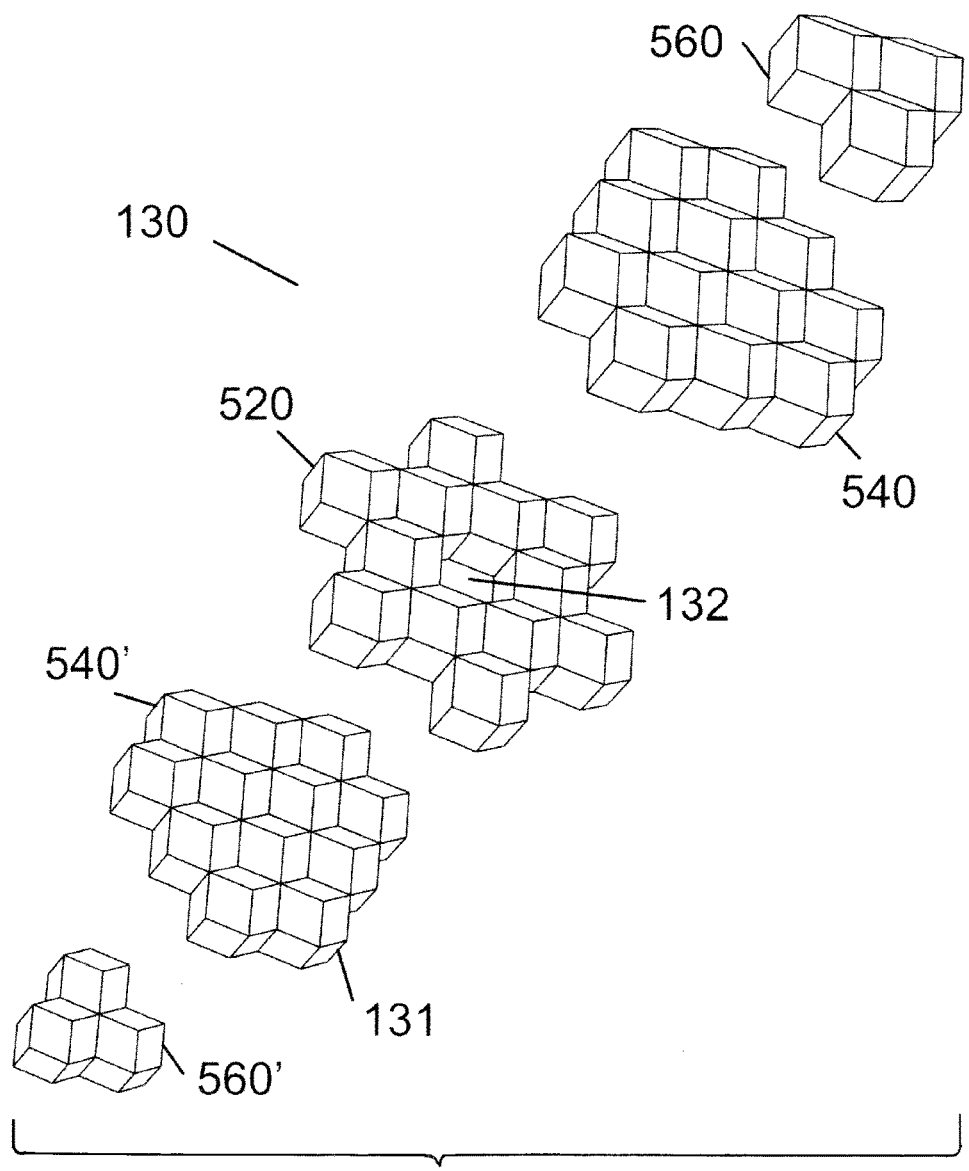
FIG. 13A is an exploded view of a second embodiment based on rhombic dodecahedra.
Figure 13B:
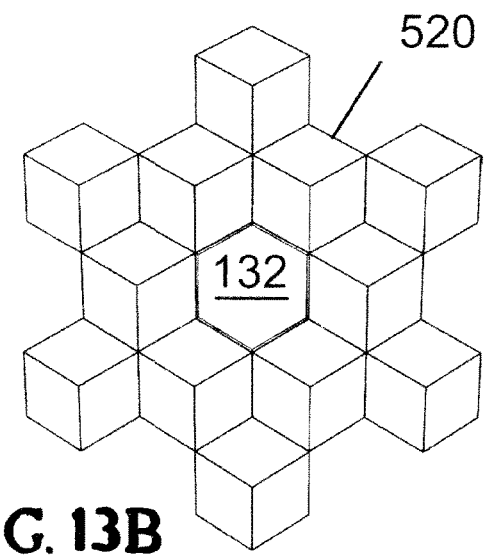
FIG. 13B is a plan view of the central layer of the second embodiment according to FIG. 13A.

In one alternative embodiment generally designated 130 and illustrated in FIGS. 13A and 13B, the primary magnets 131 of the magnet array 130 are rhombic dodecahedra which shape is illustrated in FIG. 5N.

FIG. 13A illustrates an array based on this configuration in exploded view and FIG. 13B illustrates a central layer of such an array. The rhombic dodecahedra are configured in layers 520, 540, 560, each of which is based on a triangular, 2-dimensional lattice of points. The central layer 520 is bounded by first layers 540 and 540', and then second layers 560 and 560'. The 2-dimensional lattices together comprise a face-centered cubic lattice. Again, the central layer comprises a lattice site, centrally located, designated as the testing volume 132. In embodiments, the rhombic dodecahedra may be chamfered, or the lattice expanded, to permit access to the central testing volume.

The overall nature of the arrangement and the configuration of any structural supports or frames will be readily understood by those skilled in the art, using the same principles as the Example of the First Embodiment.

Third Embodiment

Figure 14:
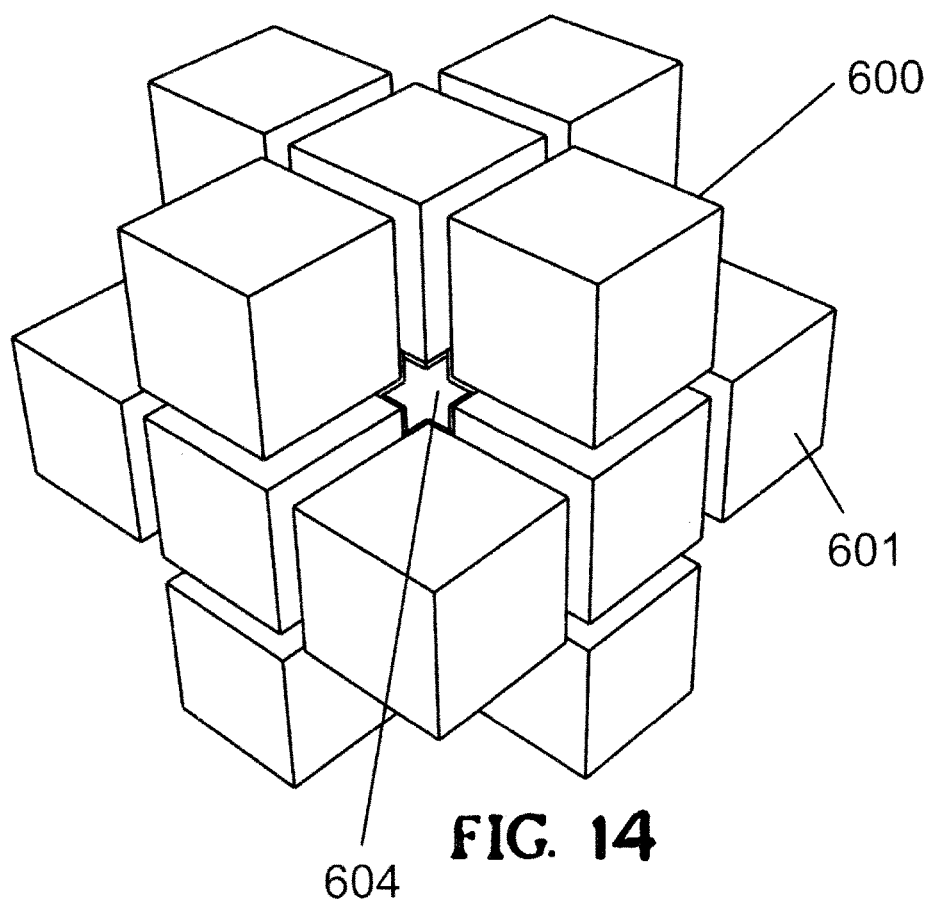
FIG. 14 is an array structure according to a third embodiment.

A third alternative embodiment is shown in FIG. 14 and is generally designated 600. The magnet array 600 shown in FIG. 14 is based on a space-filling structure consisting solely of cubes 601 in a portion of a simple cubic lattice. The central cube is removed to provide the central cavity or testing volume 604. The lattice is expanded, and cubes on the corners of the structure (eight in number) are removed to accommodate a sample-tube, which is not illustrated. If a vector normal to a face of this block is chosen as the (colatitude) θ=0 axis of a spherical coordinate system and magnetizations are chosen according to the equation explained above, then the sample-tube entry axis will be at the "magic angle" with respect to the uniform field axis in the central cavity.

Fourth Embodiment

Figure 15:
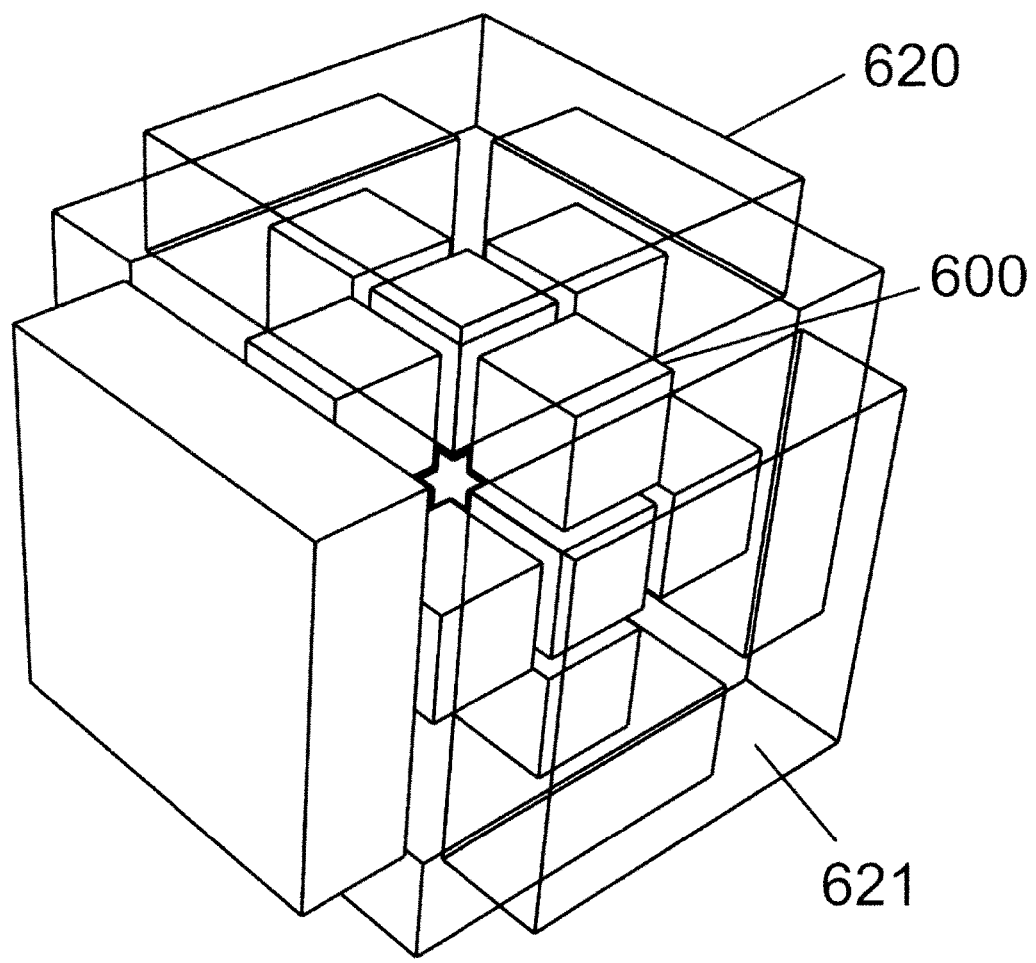
FIG. 15 is an array structure according to a fourth embodiment.

A fourth alternative embodiment is shown in FIG. 15 and is generally designated 620. In this embodiment the design 600 of FIG. 14 is supplemented with square parallelepipeds 621. In embodiments this provides a higher field strength within the central cavity and a coarse-shimming capability if the outer elements are affixed to moveable structures. Those skilled in the art will readily understand how to frame and articulate the magnets to achieve desired aims.

Fifth Embodiment

Figure 16:
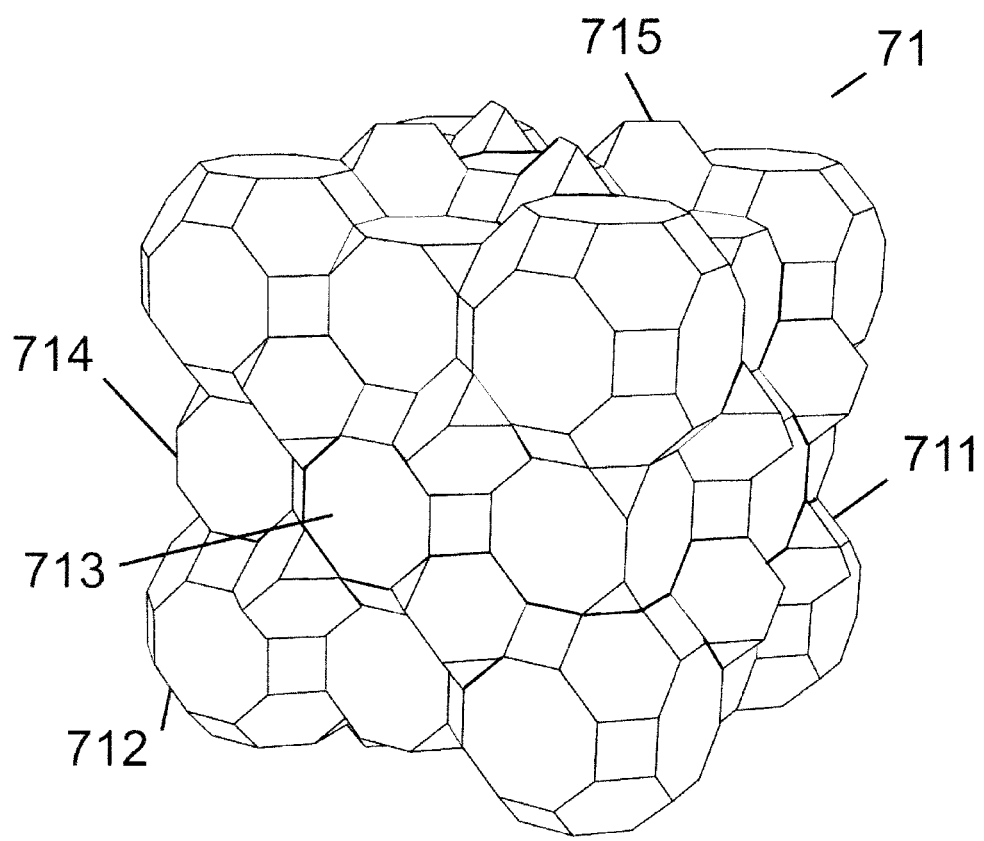
FIG. 16 is an array structure according to a fifth embodiment.

A fifth alternative embodiment is shown in FIG. 16 and is generally designated 71. As in the design of FIG. 14, the magnet block 711 of this embodiment is based on a space-filling structure consisting of portions of four interpenetrating face-centered cubic (fcc) lattices, but with different polyhedra. Truncated cuboctahedra occupy the corners 712 and face-centers 713 of the magnet-block 711, and truncated cubes are placed at the edge-centers 714, with the central truncated cube removed to provide the central cavity. These two lattices are supplemented by two other fcc lattices, each of whose sites are occupied by truncated tetrahedra 715, which are present in two different orientations.

If the edge-centered truncated cubes 714 are removed and the lattices are expanded to the degree necessary, and if the interior-most truncated tetrahedra are made smaller or are chamfered, then a channel is created, which can be used as an access port to the interior of the structure. Alternatively, holes can be drilled through either the truncated cuboctahedra or the truncated cubes to accommodate the insertion of a sample tube. In this case, if the truncated cubes are affixed to structures that permit their movement toward and away from the center of the assembly, a coarse-shimming capability can be realized. This coarse-shimming capability will have twelve degrees of freedom, and these twelve individual motions can be combined into concerted motions of all twelve magnets, which can facilitate assignment of the motions to particular functional components (e.g., x, yz, $y^2-z^2$, etc.) of field gradients to be shimmed based on symmetry considerations.

Sixth Embodiment

Figure 17A:
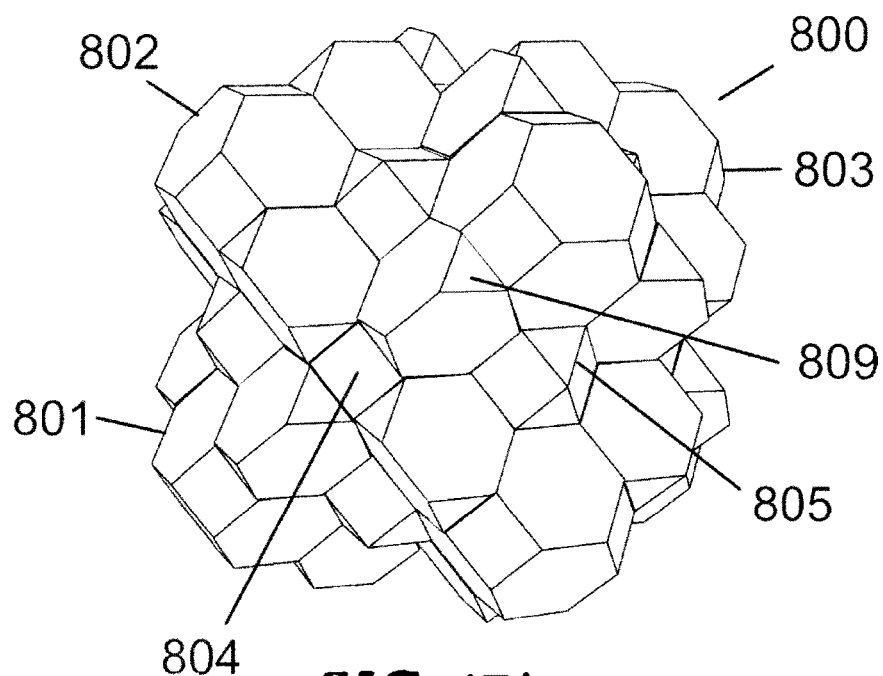
FIG. 17A is an array structure according to a sixth embodiment.
Figure 17B:
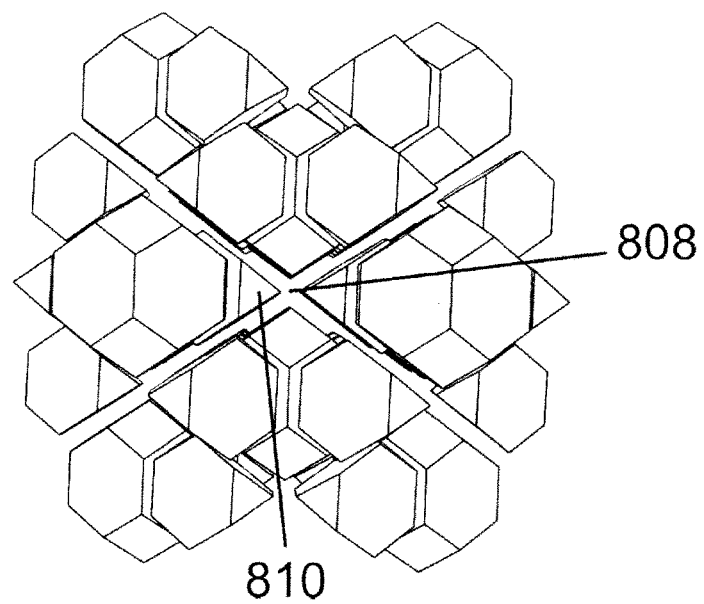
FIG. 17B is the array structure shown in FIG. 17A having a sample channel.

A further embodiment is shown in FIGS. 17A and 17B and is generally designated 800.

FIG. 17A shows an embodiment generally designated 800 for a magnet array 801 based on a space-filling structure consisting of portions of four interpenetrating face-centered cubic lattices. Truncated octahedra 802 occupy the corners 803 and face-centers 804 of the magnet-block shown. Cuboctahedra 805 are placed at the edge-centers, and then the central cuboctahedron is removed 808 in order to provide a central cavity for a sample, NMR detection coil, electronic field-shimming measures, sample spinner, or other apparatus. These two lattices are supplemented by two other lattices, each of whose lattice sites are occupied by truncated tetrahedra 809 (in two different orientations).

FIG. 17B shows how a sample channel can be incorporated into the array if the edge-centered cuboctahedra 805 are removed and the lattices are expanded to the degree necessary, or if the interior-most truncated tetrahedra 810 are made smaller or are chamfered. Alternatively, holes can be drilled through the cuboctahedra to accommodate the insertion of a sample tube. In this case, if the cuboctahedra are affixed to structures that permit their movement toward and away from the center of the assembly, a coarse-shimming capability can be realized. This coarse-shimming capability will have twelve degrees of freedom, and these twelve individual motions can be combined into concerted motions of all twelve magnets, which can facilitate assignment of the motions to particular functional components (e.g., x, yz, $y^2-z^2$, etc.) of field gradients to be shimmed based on symmetry considerations.

Further Embodiments

Further alternative embodiments are shown in FIGS. 18A through 18D. For clarity, only portions of the lattice configurations are shown. It will be understood that, as with the first embodiment, the lattice configurations can be defined by choosing from the infinite point sets defining the underlying lattices those points nearest a designated "origin" point, [0,0,0] within a neighborhood defined by a maximum radius. The points chosen for the lattice configuration will generally include all those generated from a given point by considerations of symmetry. That is, for example, inclusion of the lattice point [3,2,0] will induce inclusion of the symmetry-related points in the whole class $\overline{[3,2,0]}$, that is, the points [3,−2,0], [3,0,2], [3,0,−2], [2,3,0], [2,−3,0], and all others, for a total of 24 in number, obtained by permuting the numbers and changing signs. It will further be understood that some of those classes of points will be excluded from the lattice configuration in order to facilitate access to the testing volume.

Figure 18A:
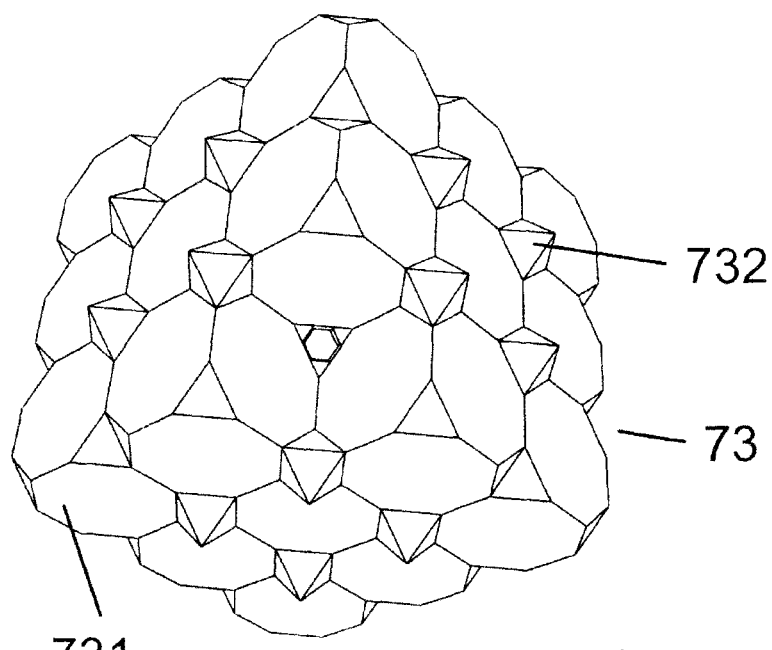
FIGS. 18A through 18D are depictions of example space-filling assemblies of regular and semi-regular polyhedra corresponding to further alternative embodiments.

FIG. 18A shows an embodiment of a magnet array generally designated 73 comprising two interpenetrating simple cubic lattices, one with truncated cubes 731 and one with octahedra 732.

Figure 18B:
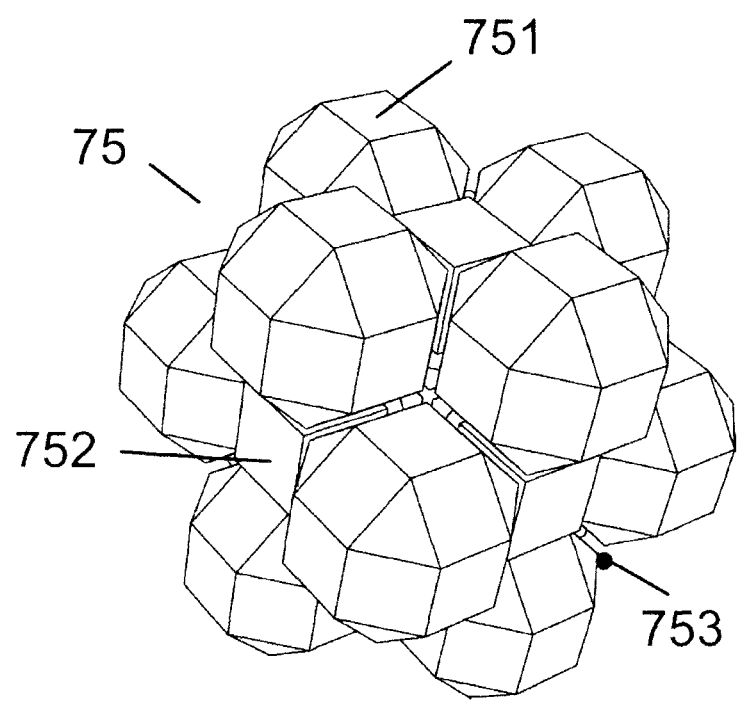

FIG. 18B shows an embodiment of a magnet array generally designated 75 comprising four interpenetrating face-centered cubic lattices, one with rhombicuboctahedra 751, one with cubes 752, and two with tetrahedra 753 in each of two orientations. The latter components are not shown in this illustration.

Figure 18C:
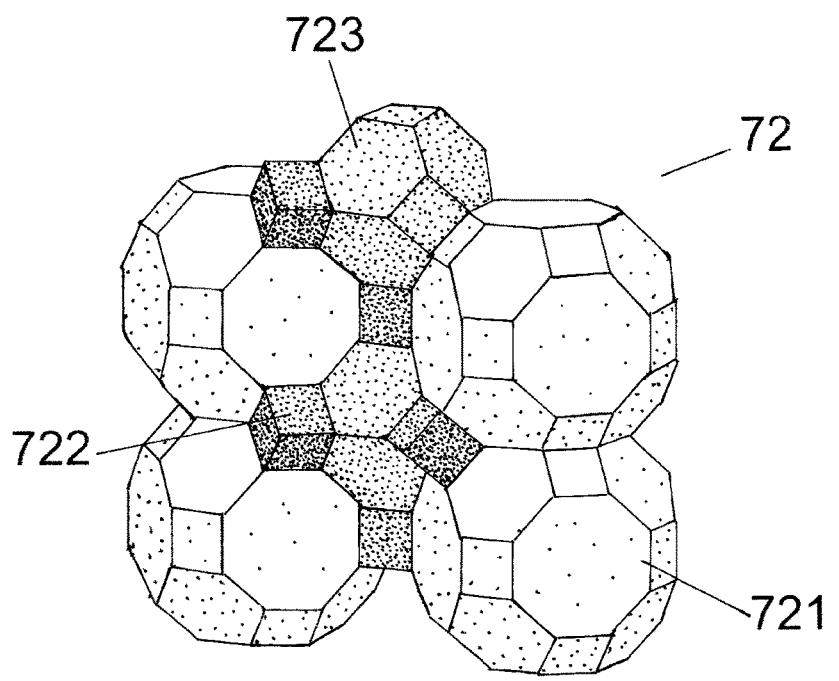

FIG. 18C shows an embodiment of a magnet array generally designated 72 comprising five interpenetrating simple cubic lattices, one with truncated cuboctahedra 721, one with truncated octahedra 723, and three with cubes 722 in each of three orientations.

Figure 18D:
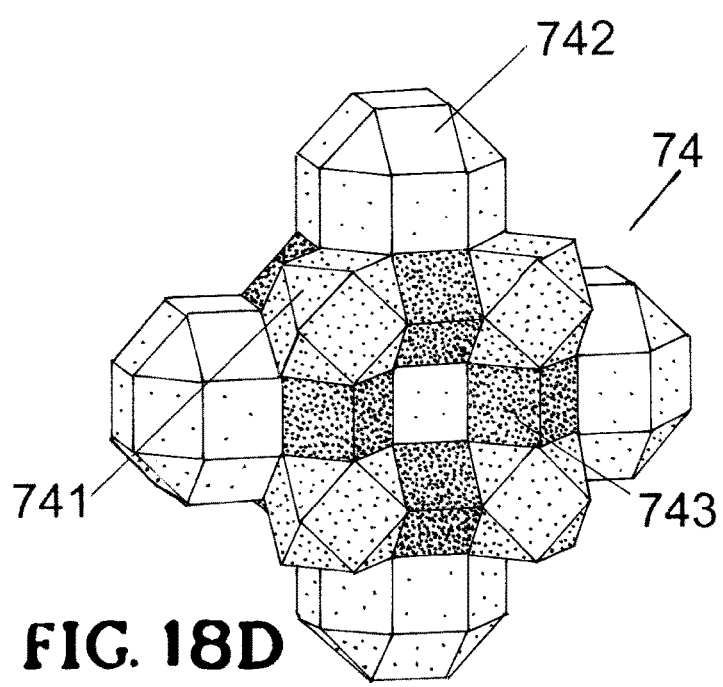

FIG. 18D shows an embodiment of a magnet array generally designated 74 comprising five interpenetrating simple cubic lattices, one with cuboctahedra 741, one with rhombicuboctahedra 742, and three with cubes 743 in each of three orientations.

The embodiments and examples presented herein are illustrative of the general nature of the subject matter disclosed and claimed and are not limiting. It will be understood by those skilled in the art how these embodiments can be readily modified and/or adapted for various applications and in various ways without departing from the spirit and scope of the subject matter claimed. Phrases, words and terms employed herein are illustrative and are not limiting. Where permissible by law, all references cited herein are incorporated by reference in their entirety. It will be appreciated that any aspects of the different embodiments disclosed herein may be combined in a range of possible alternative embodiments, and alternative combinations of features, all of which varied combinations of features are to be understood to form a part of the subject matter claimed. Particular embodiments may alternatively comprise or consist of or exclude any one or more of the elements disclosed.

The embodiments of the invention in which an exclusive property or privilege is claimed are defined as follows:

1. A magnet array comprising:
a plurality of polyhedral magnets arranged in a lattice configuration wherein individual polyhedral magnets are placed with their centers substantially coinciding with a finite set of points defined by a lattice, said plurality of polyhedral magnets at least partly enclosing a testing volume, said magnet array having an associated magnetic field with a designated field direction $\hat{v}$, wherein the magnetization direction $\hat{m}$ of an individual polyhedral magnet located at a displacement vector r from an origin point in the testing volume is determined by the formula:

$$\hat{m}=(2(\hat{v}\cdot\vec{r})\vec{r}-(\vec{r}\cdot\vec{r})\hat{v})/\vec{r}\cdot\vec{r}.$$

2. The magnet array according to claim 1, wherein individual ones of said polyhedral magnets are selected from the group consisting of:
a truncated cube,
a rhombic dodecahedron,
a Platonic solid,
an Archimedean solid,
a Johnson solid,
a chamfered polyhedron, and
a truncated polyhedron.

3. The magnet array according to claim 2, wherein said direction $\hat{v}$, corresponds to a body diagonal of said magnet array, a face normal axis of said magnet array, or a face diagonal of said magnet array.

4. The magnet array according to claim 1, wherein the lattice is a Bravais lattice.

5. The magnet array according to claim 4, wherein the lattice is a simple cubic lattice, a body centered cubic lattice, a face centered cubic lattice, or a hexagonal lattice.

6. The magnet array according to claim 1, wherein said polyhedral magnets comprise pluralities of first and second polyhedral magnets, said second polyhedral magnets being smaller than said first polyhedral magnets, and wherein a plurality of said second polyhedral magnets at least partly define a sample channel.

7. The magnet array according to claim 6, wherein said sample channel is oriented along a body diagonal of said magnet array.

8. The magnet array according to claim 6, further comprising a sample rotator.

9. A magnetic resonance device comprising the magnet array according to claim 1.

10. A shimming assembly for the magnet array according to claim 1, said shimming assembly comprising polyhedral shimming magnets comprised within said magnet array, said shimming magnets being actuable by a user to move within said shimming assembly.

11. The magnet array according to claim 1, further comprising a plurality of shimming magnets occupying positions within said lattice configuration.

12. A magnetic array according to claim 1, further comprising two or more interpenetrating lattices.

13. A magnetic array according to claim 12, wherein the magnetic array comprises two or five interpenetrating simple cubic lattices.

14. A magnetic array according to claim 12, wherein the magnetic array comprises four interpenetrating face-centered cubic lattices.

15. A method for generating a magnetic field having a field direction $\hat{v}$, the method comprising providing an array of polyhedral magnets in a lattice configuration wherein individual polyhedral magnets are placed with their centers substantially coinciding with a finite set of points defined by a lattice, wherein the magnetization direction $\hat{m}$ of an individual said polyhedral magnet located at a displacement vector $\vec{r}$ from an origin point is determined by the formula:

$$\hat{m}=(2(\hat{v}\cdot\vec{r})\vec{r}-(\vec{r}\cdot\vec{r})\hat{v})/\vec{r}\cdot\vec{r}.$$

16. The method according to claim 15, wherein individual ones of said polyhedral magnets are selected from the group consisting of:
- a truncated cube,
- a rhombic dodecahedron,
- a Platonic solid,
- an Archimedean solid,
- a Johnson solid,
- a chamfered polyhedron, and
- a truncated polyhedron.

17. The method according to claim 16, wherein said polyhedral magnets are truncated cubes and wherein said direction corresponds to a body diagonal of said magnet array or to a face normal axis of said magnet array or a face diagonal of said magnet array.

18. The method according to claim 15, wherein the lattice is a Bravais lattice.

19. The method according to claim 18, wherein the lattice is simple cubic lattice, a body centered cubic lattice, a face centered cubic lattice, or a hexagonal lattice.

20. The method according to claim 15, further comprising providing a testing volume within said magnet array and wherein said polyhedral magnets comprise pluralities of first and second polyhedral magnets, said second polyhedral magnets being smaller than said first polyhedral magnets, and wherein a plurality of said second polyhedral magnets at least partly define a sample channel.

21. A method for determining the magnetic resonance properties of a sample, the method comprising positioning the sample in a magnetic field in accordance with claim 15.

22. A magnetic resonance device comprising a magnet array comprising first and second polyhedral magnets arranged in a lattice configuration and at least partly enclosing a testing volume, wherein said first and second polyhedral magnets are truncated cubes and said second polyhedral magnets are smaller than said first polyhedral magnets and at least partly define a sample channel extending along a body diagonal of said magnet array.

* * * * *

UNITED STATES PATENT AND TRADEMARK OFFICE
CERTIFICATE OF CORRECTION

PATENT NO. : 9,952,294 B2
APPLICATION NO. : 14/293544
DATED : April 24, 2018
INVENTOR(S) : Garett M. Leskowitz Page 1 of 1

It is certified that error appears in the above-identified patent and that said Letters Patent is hereby corrected as shown below:

In the Claims

In Column 26, Claim 1, please change the tenth line of text to include the arrow after the "r". The full line of text is below:
polyhedral magnet located at a displacement vector $\vec{r}$ In Column 27, Claim 15, please change the eighth line of text to include the arrow after the "r". The full line of text is below:
vector $\vec{r}$ from an origin point is determined by the formula:

In Column 28, Claim 17, please change the third line of text to include $\hat{v}$. The full line of text is below:
direction $\hat{v}$ corresponds to a body diagonal of said magnet Signed and Sealed this
Ninth Day of October, 2018

Andrei Iancu
*Director of the United States Patent and Trademark Office*